United States Patent

Cronmiller

(10) Patent No.: US 10,720,031 B1
(45) Date of Patent: Jul. 21, 2020

(54) WARNING LIGHT BEACONS

(71) Applicant: STAR HEADLIGHT & LANTERN CO., INC., Avon, NY (US)

(72) Inventor: James J. Cronmiller, Penfield, NY (US)

(73) Assignee: Star Headlight & Lantern Co., Inc., Avon, NY (US)

( * ) Notice: Subject to any disclaimer, the term of this patent is extended or adjusted under 35 U.S.C. 154(b) by 0 days.

(21) Appl. No.: 16/431,596

(22) Filed: Jun. 4, 2019

Related U.S. Application Data

(60) Provisional application No. 62/680,445, filed on Jun. 4, 2018.

(51) Int. Cl.
G08B 5/22 (2006.01)
G08B 5/38 (2006.01)
F21V 3/02 (2006.01)
H05K 1/18 (2006.01)
F21V 23/00 (2015.01)
F21V 23/04 (2006.01)
H05K 3/30 (2006.01)
H05B 45/10 (2020.01)
(Continued)

(52) U.S. Cl.
CPC .............. G08B 5/38 (2013.01); F21V 3/02 (2013.01); F21V 23/005 (2013.01); F21V 23/0407 (2013.01); H05B 45/10 (2020.01); H05K 1/181 (2013.01); H05K 3/303 (2013.01); F21Y 2113/13 (2016.08); F21Y 2115/10 (2016.08); H05K 2201/10106 (2013.01); H05K 2201/10545 (2013.01)

(58) Field of Classification Search
CPC .... G08B 5/38; G08B 5/00; F21S 9/022; F21S 9/037; F21S 8/00; F21V 5/04; F21V 13/02; F21V 21/30; F21V 7/0008; B60Q 1/26

USPC .............. 340/815.45, 815.4, 815.73, 815.75
See application file for complete search history.

(56) References Cited

U.S. PATENT DOCUMENTS 3,221,162 A   11/1965  Heenan et al.
5,224,773 A    7/1993  Arimura
5,237,490 A    8/1993  Ferng
(Continued)

OTHER PUBLICATIONS

Star Headlight & Lantern Co., Inc., C2 LED Series, 2016.
(Continued)

Primary Examiner — Toan N Pham
(74) Attorney, Agent, or Firm — Kenneth J. LuKacher; Kenneth J. LuKacher Law Group

(57) ABSTRACT

A warning light beacon having a base, a lens providing a dome over the base, and a circuit board extending upright from the base perpendicular to the base. The circuit board has two surfaces with mounted light sources, such as LEDs, providing a same or different colors of light. One or more light blocking elements, each preferably a non-operative electrical component, are mounted upon each of the surfaces, each between groups of one or more light sources, to dispose each of the groups to substantially illuminate a different one of a plurality of regions about 360 degrees of the lens. Sequential illumination of each of the regions along the 360 degrees of the lens by at least one light source associated with the region enables perception of rotating light outward via the lens. Such regions along the lens may also be illuminated simultaneously to provide solid-on or flashing patterns.

32 Claims, 13 Drawing Sheets

(51) Int. Cl.
*F21Y 115/10* (2016.01)
*F21Y 113/13* (2016.01)

(56) References Cited

U.S. PATENT DOCUMENTS

| | | | |
|---|---|---|---|
| 5,436,535 | A | 7/1995 | Yang |
| 5,585,783 | A | 12/1996 | Hall |
| 5,642,933 | A | 7/1997 | Hitora |
| 5,688,042 | A | 11/1997 | Madadi et al. |
| 5,694,112 | A | 12/1997 | Vannrox et al. |
| 5,806,965 | A | 9/1998 | Deese |
| 5,890,794 | A | 4/1999 | Abtahi et al. |
| 5,929,788 | A | 7/1999 | Vukosic |
| 6,086,220 | A | 7/2000 | Lash et al. |
| 6,183,100 | B1 | 2/2001 | Suckow et al. |
| 6,380,865 | B1 | 4/2002 | Pederson |
| 6,425,678 | B1 * | 7/2002 | Verdes ............ F21V 29/74 362/244 |
| 6,483,254 | B2 | 11/2002 | Vo et al. |
| 6,483,439 | B1 | 11/2002 | Vukosic |
| 6,626,557 | B1 | 9/2003 | Taylor |
| 6,667,582 | B1 | 12/2003 | Procter |
| 6,844,824 | B2 | 1/2005 | Vukosic |
| 6,991,351 | B1 | 1/2006 | Petrick |
| 7,252,405 | B2 | 8/2007 | Trenchard et al. |
| 7,534,009 | B2 | 5/2009 | Trojanowski et al. |
| 8,662,702 | B2 | 3/2014 | Datz et al. |
| 8,840,268 | B2 | 9/2014 | Datz et al. |
| 10,030,826 | B2 | 7/2018 | Belitz |
| 10,309,595 | B1 | 6/2019 | Datz et al. |
| 2002/0048174 | A1 | 4/2002 | Pederson |
| 2004/0156210 | A1 | 8/2004 | Pederson |
| 2005/0110649 | A1 | 5/2005 | Fredericks et al. |
| 2006/0114118 | A1 | 6/2006 | Toulmin et al. |
| 2006/0132323 | A1 | 6/2006 | Grady, Jr. |
| 2006/0181879 | A1 | 8/2006 | Pederson |
| 2008/0088477 | A1 | 4/2008 | Martin et al. |
| 2010/0244748 | A1 | 9/2010 | Haab et al. |
| 2014/0160744 | A1 | 6/2014 | Wimberly |

OTHER PUBLICATIONS

Star C2 LED Beacons, YouTube Screen Printout, SIRENNET, Oct. 27, 2014.
ECCO Safety Group, ECCO(R) 2016 Product Guide, ECCO(R) Beacons LED, pp. 22-23, 2016.

* cited by examiner

WARNING LIGHT BEACONS

This application claims priority to U.S. Provisional Patent Application No. 62/680,445, filed Jun. 4, 2018, which is incorporated herein by reference.

FIELD OF THE INVENTION

The present invention relates to warning light beacons, and particularly, to warning light beacons having illumination provided by light sources provided by LEDs mounted upon two sides of a single circuit board within a lens that provides a dome of the beacon. The invention is useful in that the LEDs can be activated to enable projection of multiple patterns of light, including solid, flash, or simulating rotating light, outwards from the beacon as visual warning signals. The LEDs may emit light of the same color to provide an LED beacon having mono-color operation, or light of different colors to provide an LED beacon having multiple selectable colors of operation.

BACKGROUND OF THE INVENTION

Light beacons have been provided with LEDs as light sources, such as shown for example in U.S. Pat. No. 6,425,678, issued Jul. 30, 2002, to Verdes et al., U.S. Pat. No. 5,237,490, issued Aug. 17, 1993, to Ferng, U.S. Pat. No. 6,991,351, issued Jan. 31, 2006, to Petrick, U.S. Pat. No. 8,662,702, issued Mar. 4, 2014, to Datz et al., and U.S. Pat. No. 8,840,268, issued Sep. 23, 2014, to Datz et al. It is often desirable to activate the LEDs to simulate a rotating pattern of light which traditionally has been provided by a parabolic reflector rotated around an incandescent, strobe or halogen bulb to distribute the light in 360 degrees. As described in these patents, LEDs may be disposed on multiple upright oriented circuit boards along a square post, or pentagon or octagon raised structures, so that selective activation along successive adjacent circuit boards can simulate a rotating motion of light in 360 degrees. While useful, it requires the expense and complexity of having to assembly four or more independent printed circuit boards having LEDs thereupon with connections to each of the boards, and often interconnections between boards, to provide the necessary power and ground lines to operate the LEDs as desired. Thus, it would be desirable to simulate rotating motion of light in 360 degrees using LEDs in a warning beacon which avoids the need for multiple circuit boards of the prior art.

While LEDs mounted on a single circuit board have been used in a light beacon, such as shown, for example, in U.S. Pat. No. 10,030,826, issued Jul. 24, 2018 to Belitz, and U.S. Pat. No. 6,844,824, issued Jan. 18, 2005, to Vukosic. Neither of these patents describe simulation of rotating motion of light in 360 degrees from LEDs.

SUMMARY OF THE INVENTION

Accordingly, a principal object of the present invention to provide warning light beacons having a single circuit board with light sources provided by LEDs which are sequentially enabled to simulate rotating motion of light.

It is a further object of the present invention is to provide warning light beacons having a single circuit board which enables simulating a rotating motion of light, and also solid and flashing patterns of light from the beacon.

A further object of the present invention is to provide a warning light beacon having a single circuit board which enables solid, flashing, and rotating motion of light from the beacon of either a single color, or of one of two selectable different colors.

Briefly described, the present invention embodies a warning light beacon having a base, a lens providing a dome over the base, and a circuit board extending upright from the base along a central axis perpendicular to the base. The circuit board has two surfaces facing opposite directions, where each of the two surfaces has a plurality of light sources, such as one or more LEDs, mounted near the central axis. One or more light blocking elements are mounted upon each of the surfaces, in which each one of the one or more light blocking element is mounted between groups of one or more light sources along the surface, to dispose each of the groups of one or more light sources to substantially illuminate a different one of a plurality of regions about 360 degrees of the lens. Each of the different ones of the regions may be illuminated sequentially along the 360 degrees of the lens, by at least one of the one or more light sources of the one of the groups associated with the region, to enable perception of rotating light outward via the lens for conveying rotating visual warning signals from the beacon.

In addition to conveying rotating warning signals, at least one of the one or more light sources of each of the groups associated with each of the different ones of regions may be operated simultaneously to illuminate the regions in one of solid on or flashing patterns of visual warning signals from the beacon.

The light sources are preferably LEDs, and each of the two surfaces of the circuit board may have: (i) two groups of light sources, each with an LED providing the same color light, with a single light blocking element mounted there between, to define four regions along the 360 degrees of lens; or (ii) two groups of light sources, each with an LED providing a different color of light, preferably two different colors, and a single light blocking element mounted there between, to define four regions along the 360 degrees of lens, or (iii) three groups of light sources, each having an LED, with two light blocking elements, to define six regions along the 360 degrees of lens. However, different number of LEDs may be provided in each group, and more than two light blocking elements may be provided on each of the two surfaces of the circuit board. The light blocking elements and the two sides of the circuit board, which extend in opposite directions from the central axis of the beacon, define the different regions of illumination about the 360 degrees of the dome. When LEDs are provided having different color light sources, they are selectively activated so that the beacon can provide light from LEDs of each of the colors in rotating, solid, or flashing patterns warning signals of that color from the beacon.

Each of the light blocking elements may be provided by a non-electrically operative (non-powered) electrical component mounted to the circuit board that extends along a direction perpendicular to the circuit board, i.e., perpendicular to the two surfaces of the circuit board having mounted light sources. Such electrical components each have a profile that extends in a first dimension along only a portion parallel to central axis, and extends along the circuit board along a second dimension perpendicular to the circuit board higher than the light sources disposed there alongside, so that the light blocking elements operate with the circuit board to enable the light sources to preferentially illuminate their associated regions along the 360 degrees about the circumference of the lens. A portion of the light from each of the different regions along the same surface of the circuit board extends or overlaps into one or more other of the regions along such same surface. The amount of overlap depends on the profile of light blocking elements along such second dimension from the circuit board. The light blocking elements may be provided by inexpensive electronic components with a sufficient high profile, such as a tall diode, that can be readily mechanically mounted to the circuit board by soldering or other mechanical attachment, such as screws and nuts.

Preferably, the lens of the beacon provides collimation of light from each of the light sources when activated outwards from the beacon, and thus is referred to herein as a collimating lens. When a collimating lens is present, the light sources are disposed along the circuit board at a distance from the base near the focal point of the collimating lens which lies along the central axis. Other lenses than those providing collimation may optionally be used.

The invention further embodies a method for providing visual warning signals from a beacon having a base and a lens providing a dome over the base, such method having the steps of: disposing a circuit board upright from the base along a central axis perpendicular to the base; providing a plurality of light sources mounted near the central axis upon each of two surfaces of the circuit board; mounting one or more light blocking elements upon each of the two surfaces, each one of the one or more light blocking element being mounted between groups of one or more of the light sources along the surface, to dispose each of the groups to substantially illuminate a different one of a plurality of regions about 360 degrees of the lens; and illuminating each of the different ones of the regions sequentially along the 360 degrees of the lens, by at least one of the one or more light sources of the one of the groups associated with the region, to enable perception of rotating light outward via the lens for conveying rotating visual warning signals from the beacon.

The mounting step further comprises the step of mounting along each of the two surfaces two groups of one or more light sources and one light blocking element between such two groups to provide regions representing four quadrants about the 360 degrees of the lens, or mounting along each of the two surfaces two of the light blocking elements alternating between different ones of three of the groups of one or more light sources, and the regions number six about the 360 degrees of the lens. The providing step may further comprise providing light sources which produce light of a same or different colors of light, and where when such light sources provide different colors of light, the illuminating step further comprises illuminating each of the different ones of the regions sequentially along the 360 degrees of the lens by at least one of the one or more light sources of a selected one of such different colors of the one of the groups associated with the region, to provide rotating visual warning signals from the beacon of such selected different color. The method may also have the step of illuminating each of the regions simultaneously, by at least one of the one or more light sources of each of the groups associated with each of the different ones of the regions, to provide one of solid on or flashing patterns of visual warning signals from the beacon.

Using a single circuit board in the warning light beacon lowers cost of manufacture by reducing the number of parts and number of electrical connections needed to assembly the beacon compared to multiple circuit boards used in prior art beacons having LEDs that provide rotating visual warning signals from the beacon. Further, reducing the number of electrical and mechanical connections to and/or between multiple circuit boards improves reliability of beacon operation by lowering the risk of mechanical failure of such connections over time such as due to exposure to vibration.

BRIEF DESCRIPTION OF THE DRAWINGS

The foregoing and other objects, features, and advantages of the invention will become more apparent from a reading of the following description in connection with the accompanying drawings in which.

DETAILED DESCRIPTION OF THE INVENTION

Figure 1:
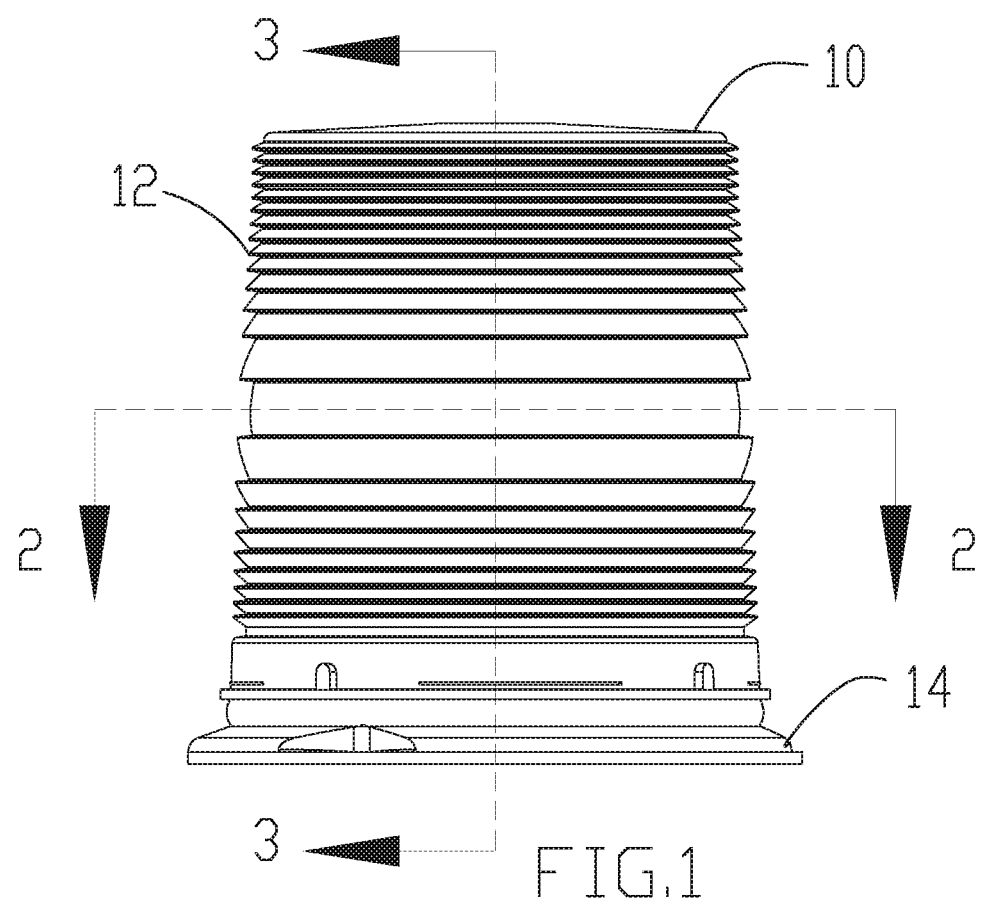
FIG. 1 is a front view of a warning light beacon embodying the present invention.

Referring to FIG. 1, a warning light beacon 10 embodying the invention is shown with a projecting element in the form of a Fresnel collimating lens 12 on a base 14, where lens 12 provides the dome of the beacon. The lens 12 may be same or similar to the collimating lens shown and described in the above-referenced Datz et al., U.S. Pat. Nos. 8,662,702, and 8,840,268, or as utilized in Star Halo® LED Beacons manufactured by Star Headlight and Lantern, Co. of Avon, N.Y., USA. Lens 12 may be of molded clear or colored plastic material, such as red or amber, formed into an inverted cup to provide the beacon's dome. The collimating lens 12 extends about the 360 degrees along the height of the beacon 10 from base 14. Alternatively, other lenses may be used than lens 12 to provide a dome that protects the circuit board 16 and electronics thereupon with same or different refractive optical properties than lens 12, or no optical refractive properties. For example, lens 12 may be replaced by a lens 12a as shown in FIG. 3A, which is of molded clear or colored plastic material without refractive optical properties. With or without refractive optical properties, beacon enclosures for light sources are commonly referred to in the warning light industry as a lens, and are referred to as such herein.

Referring to FIGS. 2, 3, 4, and 5, a single printed circuit board 16 of beacon 10 is shown having two surfaces 17a and 17b facing lens 12 in opposite directions. Circuit board 16 extends upright upon base 14 that lies within lens 12 (or 12a) of beacon 10. Four LEDs (light emitting diodes) 18 and two light blocking elements 20 are mounted to circuit board 16, where two LEDs 18 are mounted along each of surfaces 17a and 17b separated by one of the light blocking elements 20 there between. The two light blocking elements 20 each extend in opposite directions perpendicular to surfaces 17a and 17b of circuit board 16. The LEDs 18 upon circuit board 16 are disposed at a distance from base 14 near the focal point 13 of lens 12 that lies along a central (or optical) axis 11 of beacon 10 with respect to the lens.

Figure 2:
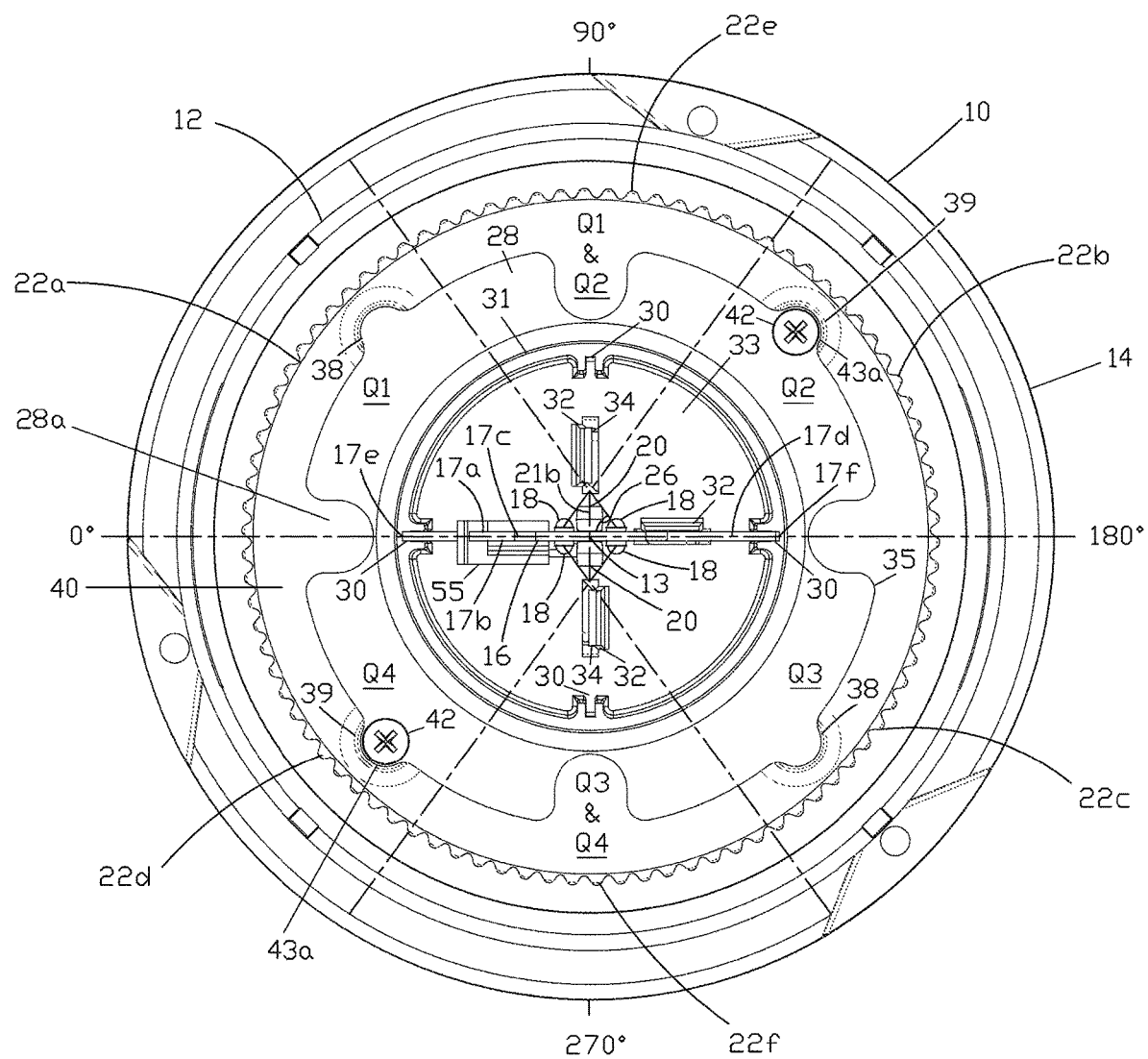
FIG. 2 is a horizontal sectional view of the beacon along line 2-2 in FIG. 1, in the direction of the arrows at the end of the section line, showing a circuit board with four LEDs disposed within a lens of the beacon.

At opposite side ends of circuit board 16 is a first edge 17e and a second edge 17f, and the circuit board 16 has two sides 17c and 17d that extend in opposite directions from central axis 11 to edges 17e and 17f, respectively. In other words, circuit board 16 extends upright upon base 14 aligned along central axis 11 so that two sides 17c and 17d of circuit board 16 extend radially outward from either side of central axis 11 in opposite directions 0 and 180 degrees, respectively, about central axis 11. Surfaces 17a and 17b of circuit board 16 extend between such side edges 17e and 17f. The two light blocking elements 20 mounted to circuit board 16 extend in opposing radial directions toward the dome at 90 and 270 degrees, respectively about central axis 11. As shown in FIG. 2, this provides four regions 22a, 22b, 22c, and 22d, called herein quadrants, of illumination labelled Q1, Q2, Q3, and Q4 substantially along 360 degrees of circumference of lens 12 at 0-90, 90-180, 180-270, and 270-0 degrees, respectively. Each light blocking element 20 operates to substantially block light from the LED 18 on one side of element 20 from shining its light directly into the quadrant of the LED 18 on the other side of the element 20. Thus, light blocking element 20 on surface 17a is disposed to block light from each of the LEDs 18 when activated along surface 17a of the circuit board 16 to establish quadrants Q1 and Q2, and light blocking element 20 on surface 17b is disposed to block light from each of the LEDs 18 when activated along surface 17b of the circuit board 16 to establish quadrants Q3 and Q4.

Light from different ones of the LEDs 18 substantially illuminates their associated quadrants. However, as depicted in FIG. 2, some of the light from each of the LEDs 18 in quadrants Q1 and Q2 extend to partially overlap in a shared region 22e, labelled Q1&Q2, along a portion of the circumference of lens 12, and some of the light from each of the LEDs 18 in quadrants Q3 and Q4 extend to partially overlap in a shared region 22f, labelled Q3&Q4, along another portion of the circumference of lens 12, where boundaries between Q1, Q2, Q3, Q4, Q1&Q2, and Q3&Q4 are indicated by dashed lines. The circuit board 16 and the two light blocking elements 20 operate to preferentially direct illumination from the four LEDs 18 when activated toward their associated four quadrants Q1, Q2, Q3, and Q4. As the LEDs 18 are disposed near the focal point 13 of lens 12 when used in beacon 10, illumination from each of such LEDs (indicated as light rays 24 in FIG. 3) when activated fills (or at least substantially fills) the lens 12 along its height from base 14 to the top of lens 12 in their associated quadrant to provide collimated light (indicated as light rays 25) as visual warning signals projected outward from beacon 10. Where lens 12a of FIG. 3A is used instead of lens 12, light rays 24 from LEDs 18 when activated are not refracted so as to provide non-collimated light rays 25a.

As will described later in connection with electrical circuitry on circuit board 16, activating the LEDs 18 of different quadrants sequentially, either Q1 to Q4, or Q4 to Q1, along the 360 degrees of the dome provided by lens 12 enables the perception of rotating light outward via the lens 12 or 12a for conveying rotating visual warning signals from the beacon 10. It has been found that during such sequential LED 18 illumination in regions 22e and 22f while being noticeable in warning signals projected from lens 12 are each such a small part of the circumference of lens 12 it can be an acceptable compromise so that circuit board surface mountable components can be used to provide light blocking elements 20. As discussed later below, the size of regions 22e and 22f along the 360 degree circumference of lens 12 depends on height of light blocking elements 20 from surfaces 17a and 17b, respectively. The LEDs 18 may also be activated simultaneously to provide solid or flashing patterns of visual warning signals from the beacon 10.

Light blocking elements 20 are preferably electrical components (or devices) with a profile that blocks light from LEDs 18 along surfaces 17a and 17b in order to establish the desired regions 22a-d or quadrants Q1-Q4 of illumination as described above. While being surface mounted to the circuit board 16 as typical of electrical components, such as soldering or held by screws via holes in circuit board 16 to nuts, the electrical components providing the light blocking elements 20 are not part of electrical circuitry on the circuit board 16. Thus, the electrical components providing the light blocking elements 20 do not need to receive power to be operative, and hence may represent electrical components which are non-electrically operative in circuitry on circuit board 16 for enabling operation of any LEDs thereupon. For example, where LEDs 18 each have a light output of +/−80 degrees outward from circuit board 16, then placing the LEDs 18 as shown without light blocking elements 20 would result in two sections divided by circuit board 16, rather than the desired four quadrants Q1, Q2, Q3, and Q4. To block the unwanted light from shining between quadrants Q1 and Q2 and between quadrants Q3 and Q4, light blocking elements 20 in form of the above described electrical component surface mounted to circuit board 16 provides a very inexpensive solution that reduces labor in the assembly of the beacon by not requiring additional circuit board(s) to enable perception of rotation by sequential operation of LEDs as used in the prior art. Blocking the unwanted light from shining between quadrants Q1 and Q4 and between quadrants Q2 and Q3 is accomplished by extending the sides 17c and 17d of circuit board 16 along edges 17e and 17f, respectively, towards lens 12.

Thus, the profile of each light blocking element 20 along the first dimension 21a (FIG. 4) parallel to central axis 11, and second dimension 21b (FIGS. 2 and 4) perpendicular to surfaces 17a and 17b of the circuit board substantially blocks the LED 18 on one side of element 20 from shining its light directly into the quadrant of the LED 18 on the other side of the element 20. Such blocking in FIG. 2 of each element 20 being illustrated by the two dashed lines extending from the LEDs 18 to lens 12 in defining Q1&Q2, and Q3&Q4, and further illustrated by dashed lines extending from the LEDs 18 in FIG. 3, where element 20 blocks light along all or substantially the height of the lens 12 (or lens 12a in FIG. 3A) from base 14. Light blocking elements 20 and LEDs 18 there alongside mirror each other upon opposite surfaces 17a and 17b of the circuit board 16. The height of each light blocking elements 20 extends from the circuit board 16 along the second dimension 21b determines an angle 26 (depicted for one of the four LEDs 18 in FIG. 2) at which emitted light from LEDs 18 are each blocked by elements 20 towards regions 22e and 22f along the circumference of lens 12. Increasing or decreasing the height of light blocking elements 20 inversely reduces or increases, respectively, this angle 26 and thus the amount each of regions 22e and 22f extends along the 360 degree circumference of lens 12 or 12a.

Figure 4:
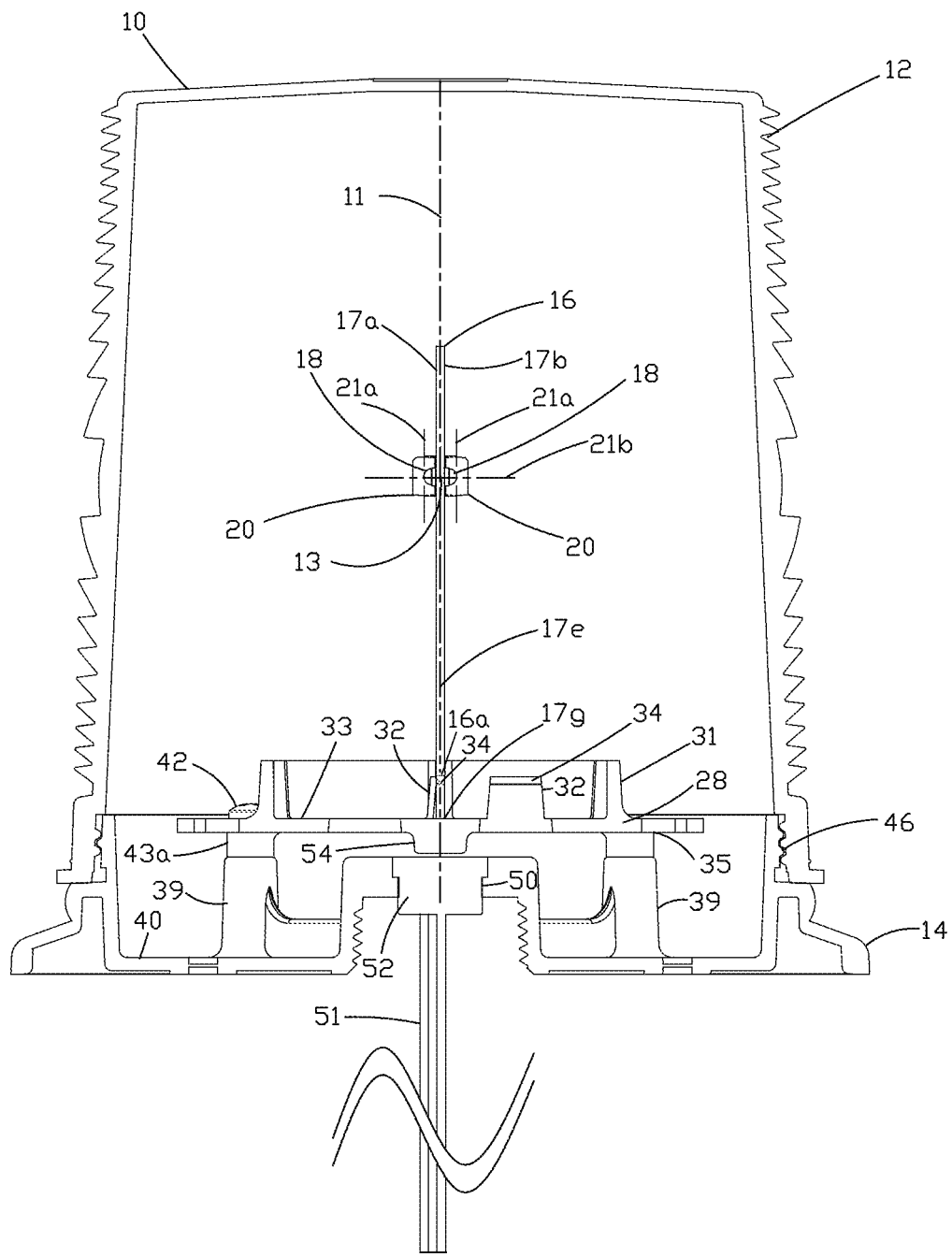
FIG. 4 is another vertical sectional view of the beacon of FIG. 1 rotated 90 degrees from line 3-3 in FIG. 1 so that the view is taken along the circuit board to show the opposing surfaces thereof.

For example, electrical components providing light blocking elements 20 may each be a tall diode, such as model SK106-TP available from Micro Commercial Components Corp. of Simi Valley, Calif., U.S.A. In this example, each diode when mounted as a light blocking element 20 upon circuit board 16 extends 6 mm along first dimension 21a (FIG. 4), 5-6 mm in second dimension 21b, and 6 mm along a dimension extending between the two LEDs 18 disposed alongside the diode. LEDs 18 may each be, for example, a XTEAWT LED manufactured by Cree, Inc. of Durham, N.C., U.S.A, which extends 2.36 mm along such second dimension 21b from respective surfaces 17a or 17b. Thus, as best shown in FIG. 4, light blocking elements 20 each extend along such first dimension 21a along only a portion of central axis 11, and along the second dimension 21b to a height from the circuit board which is higher than the LEDs 18 disposed there alongside, but less than the distance each side 17c and 17d of the circuit board 16 extends from central axis 11 to its edges 17e and 17f, respectively, above or below openings 17h provided along such edges.

Other electrical components than the diodes shown in the figures may be used for light blocking elements 20 which are sufficiently tall in profile along the second dimension 21b and wide enough in the first dimension 21a to provide the desired light blocking to establish quadrants Q1-Q4. Where light blocking elements 20 are provided by circuit board surface mountable electrical components, the light blocking elements 20 can be assembled as part of surface mount assembly of components upon the circuit board 16, which includes at least LEDs 18. Optionally, multiple non-powered electrical components may be mounted beside each other along the first dimension 21a, parallel to central axis 11, upon circuit board 16 to provide each light blocking element 20.

Figure 5:
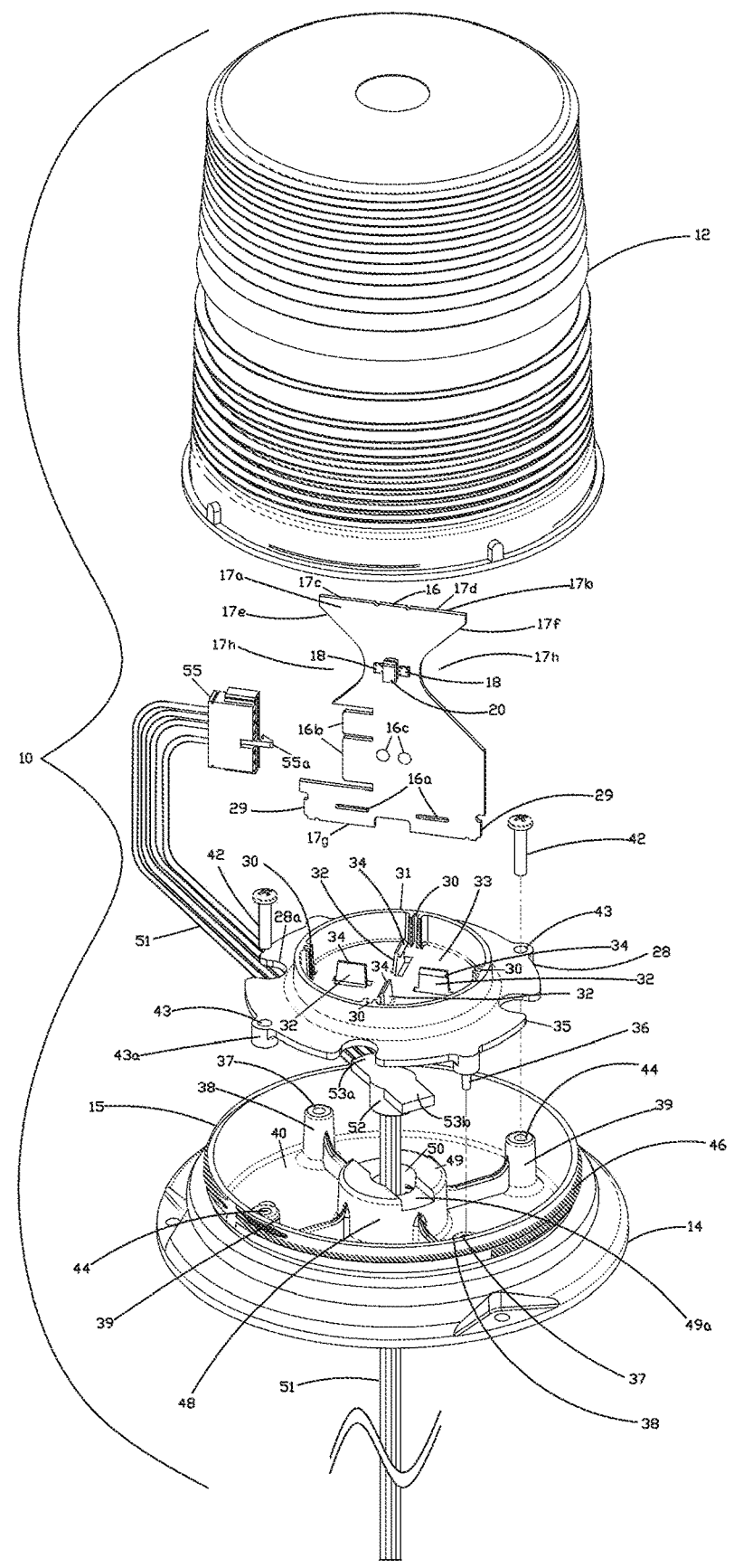
FIG. 5 is an exploded perspective view of the beacon of FIG. 1 with the circuit board of FIGS. 2-4.

As best shown in FIG. 5, the circuit board 16 is supported upright on base 14 by a bracket 28. In assembling beacon 10, two opposing bottom ends 29 of circuit board 16 are received in two vertical opposing slots (or channels) 30 along an interior surface of a circular wall 31 of bracket 28, so that the lowest part of side edges 17e and 17f of circuit board 16 each extends upon the top of circular wall 31. A pair of tabs 32 are provided which extend upward from the upper surface 33 of bracket 28. These tabs 32 extend along circuit board 16 as a bottom 17g of circuit board 16 is placed upon surface 33 of bracket 28 into slots 30 until projections 34 at the upper end of tabs 32 engage into slots 16a along circuit board 16. Once engaged with tabs 32, circuit board 16 is retained in its slots 30 upon bracket 28. Another pair of tabs 32 and another pair of vertical opposing slots 30 are optionally provided at 90 degrees rotated about axis 11 from those tabs 32 and slots 30 engaging circuit board 16 in the figures, and may alternatively be used to similarly engage circuit board 16 as desired during assembly of beacon 10.

Bracket 28 may be of molded plastic material, and represents part of base 14 upon which circuit board 16 is situated. Bracket 28 extends radially outward to provide an outer flange 35. Extending downwardly from flange 35 are two pegs 36 that are received into two holes 37 of two bosses 38 extending upwards along the interior of a bottom wall 40 of base 14. Two self-tapping screws 42 extend, via holes 43, in the outer flange 35 of bracket 28 into holes 44 of two bosses 39 extending upwards along the interior of bottom wall 40 of base 14, so that screws 42 retain bracket 28 in base 14. Holes 43 extend though bosses 43a along the underside of flange 35 of bracket 28. With the bracket 28 attached to base 14 to form a part of the base, and circuit board 16 retained to bracket 28 as described above, circuit board 16 is disposed upright and perpendicular to surface 33 of base 14.

Base 14 may be of plastic, or of metal, such as or aluminum or steel, and may be similar to that described in the above-referenced Datz et al. patents or Star Halo® LED Beacons, but structured to have a bracket 28 providing a support structure positioning circuit board 16 with respect to the central axis 11 as shown in the figures, and bracket 28 being received along the interior of a circular wall 31 of base 14. Base 14 is mounted to lens 12 (or 12a) by exterior threads 46 along base 14 engaging threads along lens 12.

Under bracket 28, along a bottom wall 40 of base 14, extends a central cylindrical wall or member 48 having a top wall 49 with an opening or hole 50 for extending wires 51 into beacon 10. Wires 51 pass through a cylindrical sealing member 52 which extend into opening 50 and frictionally engage the interior of such opening. Two flanges 53a and 53b of sealing member 52 extend outwards in opposite directions along the top of sealing member 52 and frictionally engage a slot 49a along top wall 49. Sealing member 52 is of rubber molded over wires 51 to seal opening 50 from the external environment, while orienting wires 51 to bend and extend outward through flange 53a as a ribbon of wires 51. Prior to attachment of bracket 28 to base 14 using screws 42, sealing member 52 is placed in opening 50 so that wires 51 extend through opening 50 and from sealing member 52 along the underside of bracket 28 for connection to circuit board 16. A central boss 54 (FIG. 3) extends downwardly from the underside of bracket 28 adjacent and/or abutting the top of sealing member 52.

A connector 55 (FIGS. 2 and 5) is provided at the end of wires 51 after passing from sealing member 52 upwards via one of slots 28a along the outer flange 35 of support bracket 28. Such connector 55 provides conductors or leads from the wires 51 that can make electrical contact with pads or pins along tab(s) 16b of circuit board 16 to electronics (FIG. 6) when connector 55 engages such tab(s) 16b. Tab(s) 16b extend along outer side edge 17e of circuit board 16. To retain connector 55 to circuit board 16, a clip 55a extends from connector 55 and engages the closest one of a pair of holes 16c through circuit board 16 to connector 55. The further other one of holes 16c is optional, and if present may be used to enable a tie wrap (not shown) to loop there through and then tighten around connector 55 to provide an additional mechanism for retaining connector 55 engaged along circuit board 16 to avoid risk of disconnect of the connector 55 from circuit board 16. However, other mechanism for connecting wires 51 to electronics on circuit board 16 may be used. To complete the mechanical assembly, lens 12 is mounted to base 14 to provide the dome of beacon 10 to fully enclose circuit board 16. For purposes of illustration, connector 55 and wires 51 extended thereto of FIG. 5 are not shown in FIGS. 3, 3A, and 4, and wires 51 are not shown in FIG. 2. Also, the number of wires 51 shown in FIG. 5 is meant to be an illustrative example, where the wires 51, and number thereof, to circuitry upon circuit board 16 is described below in connection with FIGS. 6 and 9.

The profile of each of sides 17c and 17d of the circuit board 16 along their respective edges 17e and 17f is contoured to provide an opening 17h, which preferably forms a right or 90 degree angle disposed at or approximately 45 degree angle tilt with respect to central axis 11. Such openings 17h provide for passage of light from the LEDs 18 in order to avoid dark or dimmed areas along lens 12 that would be caused by blockage of LED light by side edges 17e and 17f of the circuit board 16 if openings 17h were not present. Other angles than 90 degrees may be used with respect to central axis 11 depending on the height and/or diameter of lens 12 providing the dome of beacon 10. The openings 17h primarily allow propagation of light outwards from LEDs 18 mounted upon different surfaces 17a and 17b of each side edge 17e and 17f of the circuit board 16. The circuit board 16 is thin, such as 0.06 inches in width, and may be white in color to promote reflection of light from LEDs 18 outward. Optionally, side openings 17h are not used, and side edges 17f and 17e (above tab(s) 16b) both extend parallel to central axis 11.

Figure 6:
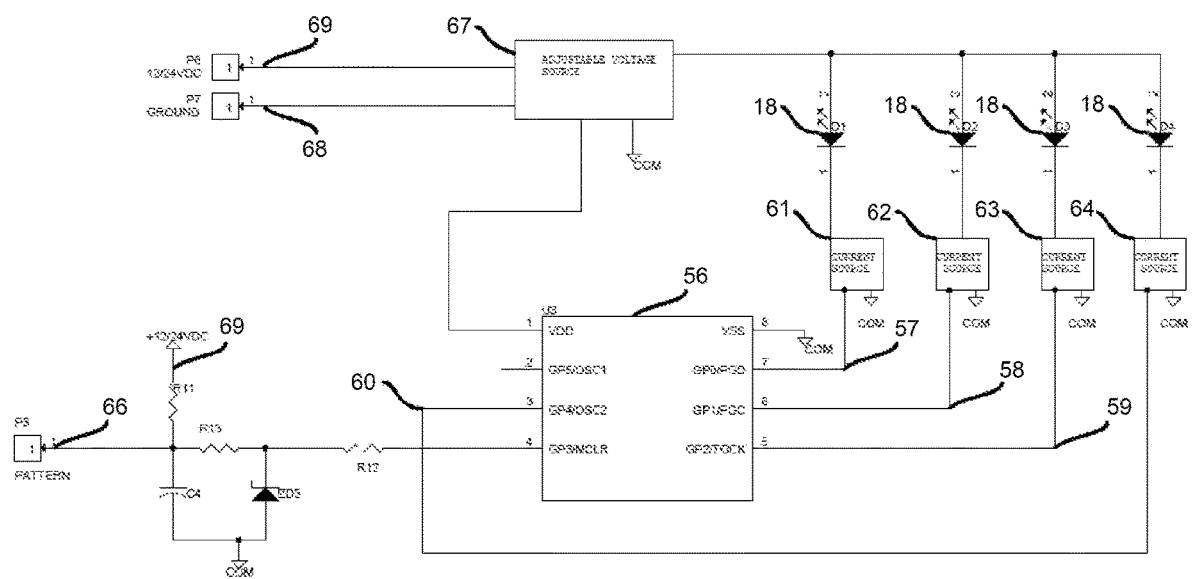
FIG. 6 is a schematic diagram of the electronics on the circuit board of FIGS. 2-5.

Referring to FIG. 6, a schematic of the electronics for beacon 10 is shown. A controller, referred to herein as a microcontroller (or microprocessor) 56, outputs signals along four enable lines 57, 58, 59, and 60 to individually control current source 61, 62, 63, and 64 of four circuits for driving each of the LEDs 18 associated with quadrants Q1, Q2, Q3, and Q4, respectively. LEDs 18 associated with quadrants Q1, Q2, Q3, and Q4 are labelled D1, D2, D3, and D4, respectively. Each enable line 57-60 when high (on) switches on drive current to their associated LED 18, and when low (off) disables drive current to such LED. The current sources 61-64 may each be provided by a MOSFET operating responsive to the respective enable lines 57-60. For purposes of illustration, other than LEDs 18, electronics on surfaces 17a and 17b of circuit board 16 are not shown in the figures.

The microcontroller 56 operates in accordance with a program stored in its memory (ROM or RAM) to enable operation of beacon 10. For example, microcontroller 56 may be a PIC microcontroller, but other programmable logic device may be used which can output enable signals to each of the circuits associated with LEDs 18.

The pattern of operating LEDs 18 by microcontroller 56 can be selected by a pattern select input 66. By placing on input 66 signals representative of a one of different values, addresses, codes, or instructions, detectable by the microcontroller 56, one of multiple different patterns of illumination by LEDs 18 and hence output light from beacon 10 may be selected, such as solid on, flashing, and rotating, and if available, one of different rates or patterns of flashing or rotation. If no signal is provided along pattern select input 66, than a default pattern is used by microcontroller 56 as set forth in memory of the microcontroller. The present invention is not limited to any particular means for pattern input selection to microcontroller 56. The flashing or rotating rates are in accordance with a preset on and off intervals stored in memory of the microcontroller 56. A clock in the microcontroller 56 is used to measure each of the intervals.

Adjustable voltage source 67 represents a voltage converter to supply power to operate microcontroller 56 and operate the individual circuits driving LEDs 18 (in accordance with the particular manufacturer specifications of the LEDs) when enabled. Thus, three wires 51 enter via hole 50 to provide a ground 68, 12/24 VDC 69, and pattern select input 66.

A synchronization line (not shown) may also be provided to the microcontroller 56 which when switched from high to low, microcontroller 56 reset the cycle of its internal clock. Such is useful when two different beacons 10 of same or different type need to be synchronized to each other so that they flash at the same time, or alternate with each other. A low power select line (not shown) may be provided to microcontroller 56, which when switched to high the microcontroller 56 sends a signal to voltage source 67 which changes the voltage to the drive circuits so that illumination from beacon 10 is in a lower power state, e.g., at or approximately 50% illumination is outputted by the LEDs 18. When low power select line is low, the microcontroller 56 disables the signal to adjustable voltage source 67 so that power output to the LEDs 18 returns to the high power state. Voltage source 67 may externally receive 12 VDC or 24 VDC 69 depending on the voltage source externally available to beacon 10. If synchronization line and low power select line are present, two additional wires 51 are provided to microcontroller 56 in addition to the three wires providing lines 66, 68, and 69. However, only three wires 51 would be used in the case of the schematic shown in FIG. 6. The electronics on circuit board 16 and programming of microcontroller 56 may be the same or similar as in mono-color Star Halo® LED Beacons.

The microcontroller 56 starts operating LEDs 18 in accordance with the selected pattern upon applied power to the microcontroller 56 from voltage source 67, i.e., when external voltage 12/24 VDC is provided via one of wires 51. Optionally, a switch may be provided along the line from the voltage source 67 to the microcontroller 56 to enable and disable operation of beacon 10, such switch may be controlled by an external line to a computer system, controller, or device to externally control beacon 10 operation.

If the signal on pattern select input 66 detected by microcontroller 56 is for operating beacon 10 in a rotating mode, the four enable lines 57, 58, 59, and 60 are continuously sequentially activated by microcontroller 56 so that the LEDs 18 associated with quadrants Q1-Q4 from beacon 10 provide light from lens 12 which simulates rotating about the 360 degrees of lens 12. In other words, in a first state enable line 57 is high and enable lines 58-60 are low; in second state enable line 58 is high and enable lines 57, 59, and 60 are low; in a third state enable line 59 is high and enable lines 57, 58, and 60 are low; in a fourth state enable line 60 is high and enable lines 57-59 are low; and then the first to fourth states continuously repeat. The time intervals between successive states may be 0.5 seconds, but other time intervals may be used as stored in memory of microcontroller 56 for selection by pattern select input 66 to select the rate of perceived rotation. If opposite direction of rotation is selected on input 66, the states are operated by the microcontroller 56 continuously in the reverse order of fourth to first.

If the signal on pattern select input 66 detected by microcontroller 56 is for operating beacon 10 in a solid on mode, all enable lines 57-60 are activated by the microcontroller 56 simultaneously. If the signal on pattern select input 66 detected by microcontroller 56 is for operating beacon 10 in a flash mode, all enable lines 57-60 are switched between high and low levels simultaneously by microcontroller 56. The rate of switching is in accordance with a preset on and off intervals stored in memory of the microcontroller 56. A single rate or multiple different rates of flashing may be stored in memory of the microcontroller 56 and selectable via pattern select input 66. Other or different patterns of LEDs 18 operation can be provided by separately enabling lines 57-60 as desired by programming microcontroller 56.

Figure 7:
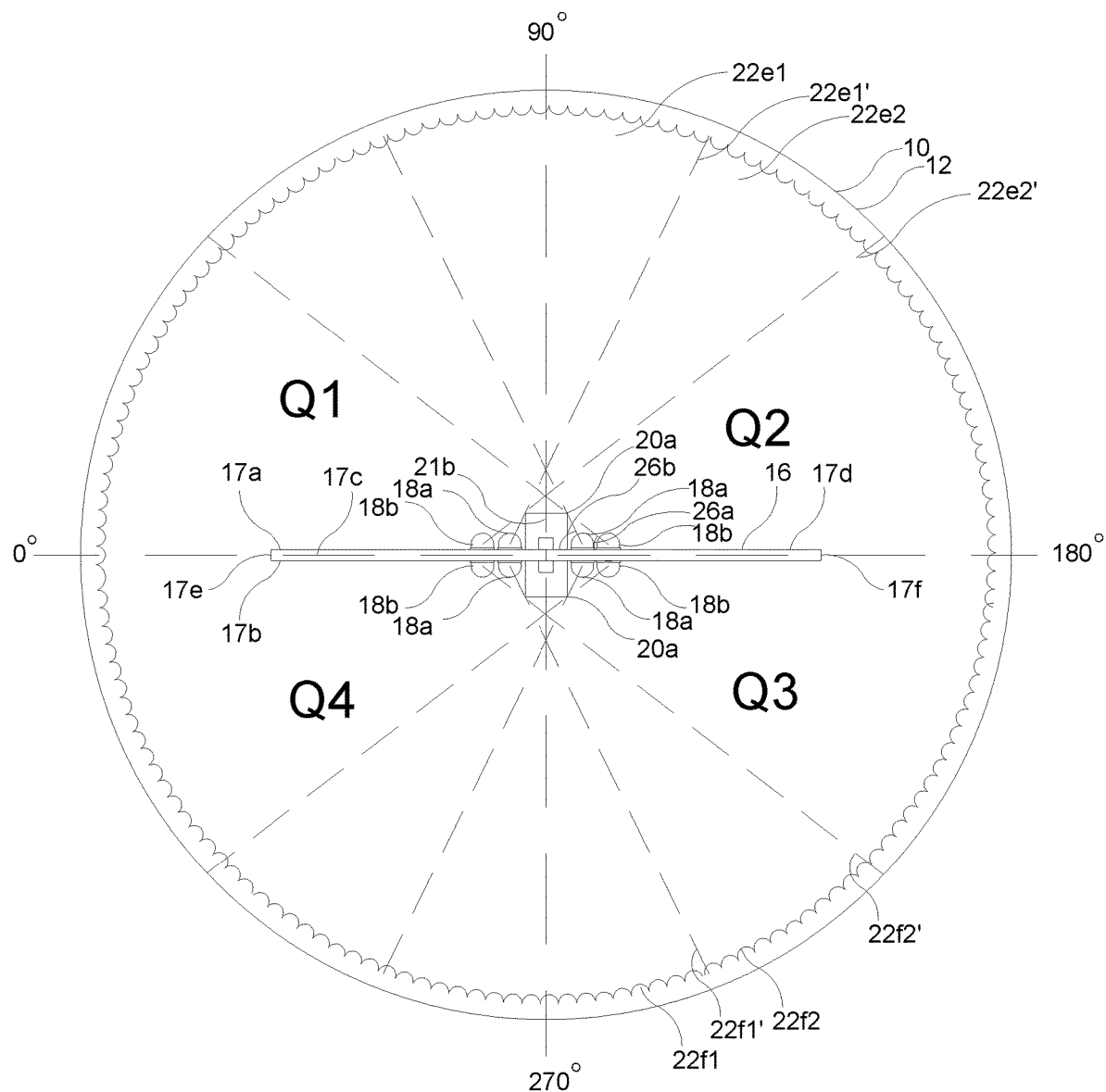
FIG. 7 is a horizontal sectional view of the beacon along line 2-2 in FIG. 1, in the direction of the arrows at the end of the section line, showing a circuit board with eight LEDs disposed within the lens of the beacon to provide warning signals of two different colors.
Figure 8:
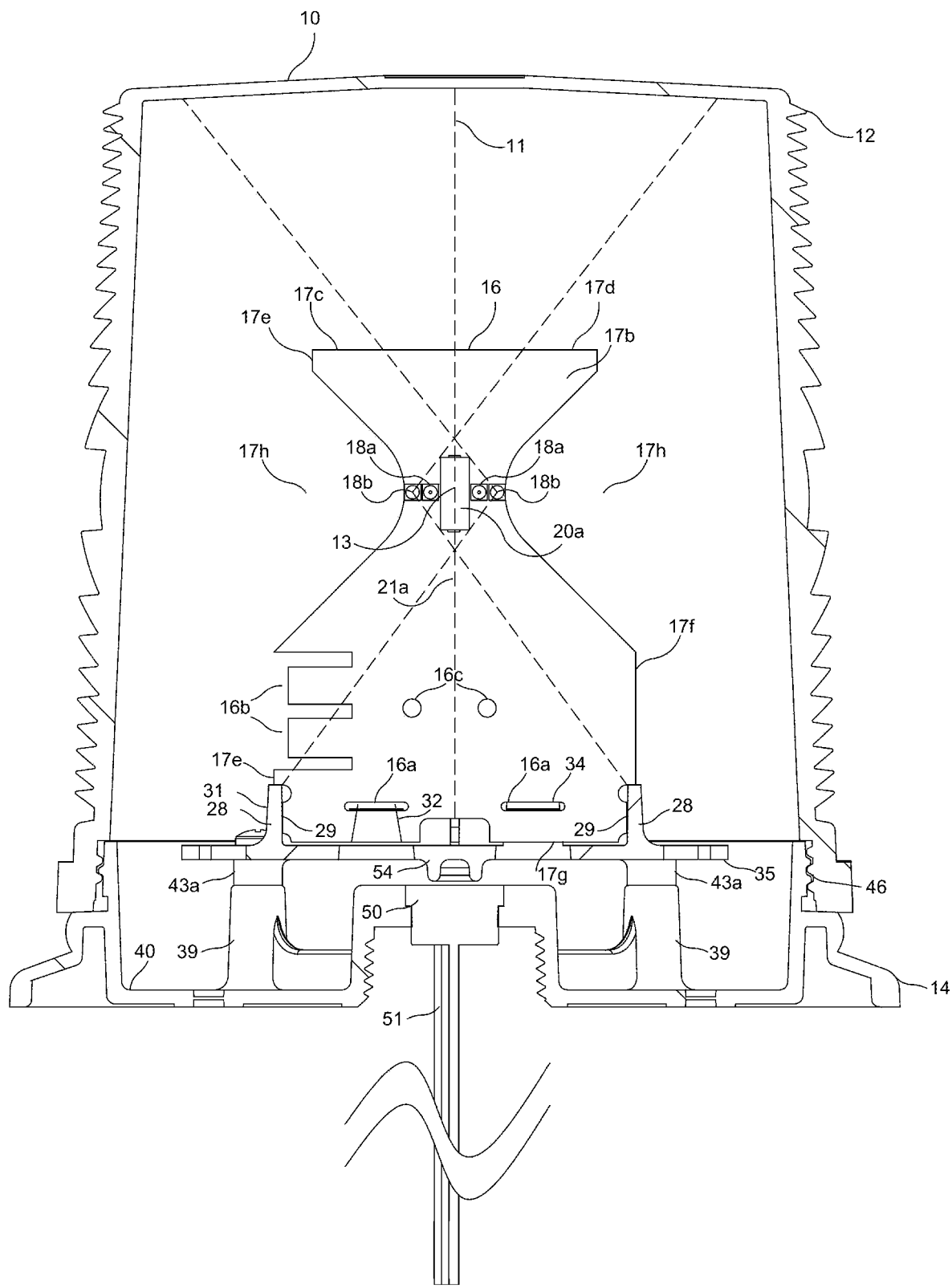
FIG. 8 is a vertical sectional view of the beacon along line 3-3 in FIG. 1 in the direction of the arrows at the end of the section line, showing one of the two opposing surfaces of the circuit board of FIG. 7.

Referring to FIGS. 7 and 8, a beacon 10 is provided with LEDs 18a and 18b enabling two different colors to be emitted from the beacon, rather than LEDs 18 which emit white or any other color light for monocolor operation. For example, the different colors of LEDs 18a and 18b may be red and green, or red and blue, with a clear color lens 12 (or 12a). LEDs 18a are identical to LEDs 18, as described earlier and shown in FIGS. 2-5 mounted on surfaces 17a and 17b of circuit board 16, with the addition of an LED 18b mounted beside each LED 18a along surfaces 17a and 17b. LEDs 18a and 18b may be, for example, the same as LEDs 18 described earlier, but differ depending on the desired different colors of light emitted. Light blocking elements 20a are provided along surfaces 17a and 17b of the circuit board 16, each between two pairs of LEDs 18a and 18b, which mirror each other along opposite sides of the light blocking element 20a. Light blocking elements 20a may be surface mounted electrical components provided along surfaces 17a and 17b and may be same or similar to light blocking elements 20, but preferably longer along first dimension 21a parallel to central axis 11, and taller in height along second dimension 21b perpendicular to circuit board 16. Thus, four LEDs 18a of a first color, and four LEDs 18b of a second color are provided in which different pairs of LEDs 18a and 18b are associated with four regions 22a, 22b, 22c, and 22d, called herein quadrants, of illumination labelled Q1, Q2, Q3, and Q4 substantially along 360 degrees of circumference of lens 12, at 0-90, 90-180, 180-270, and 270-0 degrees, respectively. As LEDs 18a and 18b are disposed near the focal point 13 of lens 12 when used in beacon 10, illumination from each of such LEDs when activated fills (or at least substantially fills) the lens 12 along its height from base 14 in their associated quadrant to provide collimated light projected from beacon 10 similar to light rays 24 and light rays 25 of FIG. 3, or project non-collimated light similar to light rays 25a of FIG. 3A when lens 12a is used.

Light from LEDs 18a and 18b substantially illuminate their associated quadrants. However, as depicted in FIG. 7, a portion of the light from each of the LEDs 18a and 18b in Q1, Q2, Q3, and Q4 extends to partially overlap their adjacent quadrants Q2, Q1, Q4, and Q3, respectively. For example, consider LEDs 18a and 18b in Q1 overlap in a shared region 22e1 and 22e2, respectively, along a portion of the circumference of lens 12 partially into Q2, and LEDs 18a and 18b in quadrant Q3 overlap in a shared region 22f1 and 22f2, respectively, along another portion of the circumference of lens 12 partially into Q3. The extent of region 22e1 into Q2 for LED 18a of Q1 extends from the 90 degree dashed line to dashed line 22e1'. The extent of region 22e2 into Q2 for LED 18b of Q1 extends from 90 degree dashed line to dashed line 22e2'. The extent of region 22f1 into Q3 for LED 18a of Q4 extends from the 270 degree dashed line to dashed line 22f1'. The extent of region 22f2 into Q2 for LED 18b of Q4 extends from 270 degree dashed line to dashed line 22f2'. The difference between size of regions 22e2 and 22f2 from regions 22e1 and 22f1, respectively is due to the height of light blocking elements 20a along second dimension 21b from circuit board 16 with respect to LEDs 18a and 18b. Similar overlap regions 22e2 and 22f2 occurs for LEDs 18a and 18b of Q2 into Q1, and LEDs 18a and 18b of Q3 into Q4. In other words, shared regions 22e1 and 22e2 in Q2 are denoted by activation of LEDs 18a and 18b, respectively, in Q1, and mirrored shared regions 22e1 and 22e2 in Q1 on the other side of 90 degrees in FIG. 7 occur by activation of LEDs 18a and 18b in LEDs 18a and 18b, respectively, in Q2. Also, shared regions 22f1 and 22f2 in Q3 are denoted by activation of LEDs 18a and 18b, respectively, in Q4, and mirrored shared regions 22f1 and 22f2 in Q4 on the other side of 270 degrees in FIG. 7 occur by activation of LEDs 18a and 18b in LEDs 18a and 18b, respectively, in Q3.

Figure 3:
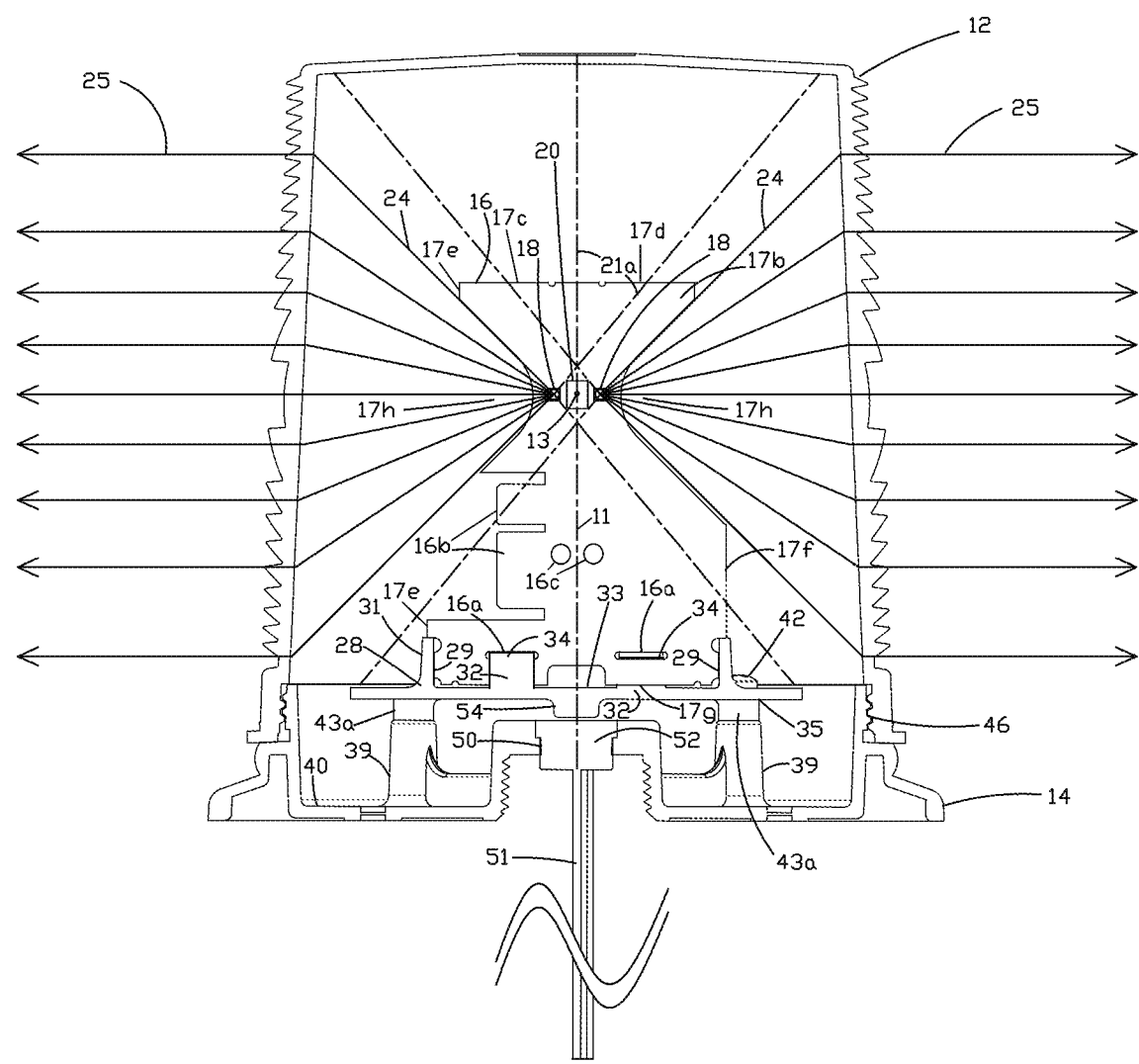
FIG. 3 is a vertical sectional view of the warning beacon along line 3-3 of FIG. 1, in the direction of the arrows at the end of the section line, showing one of the two opposing surfaces of the circuit board.
Figure 3A:
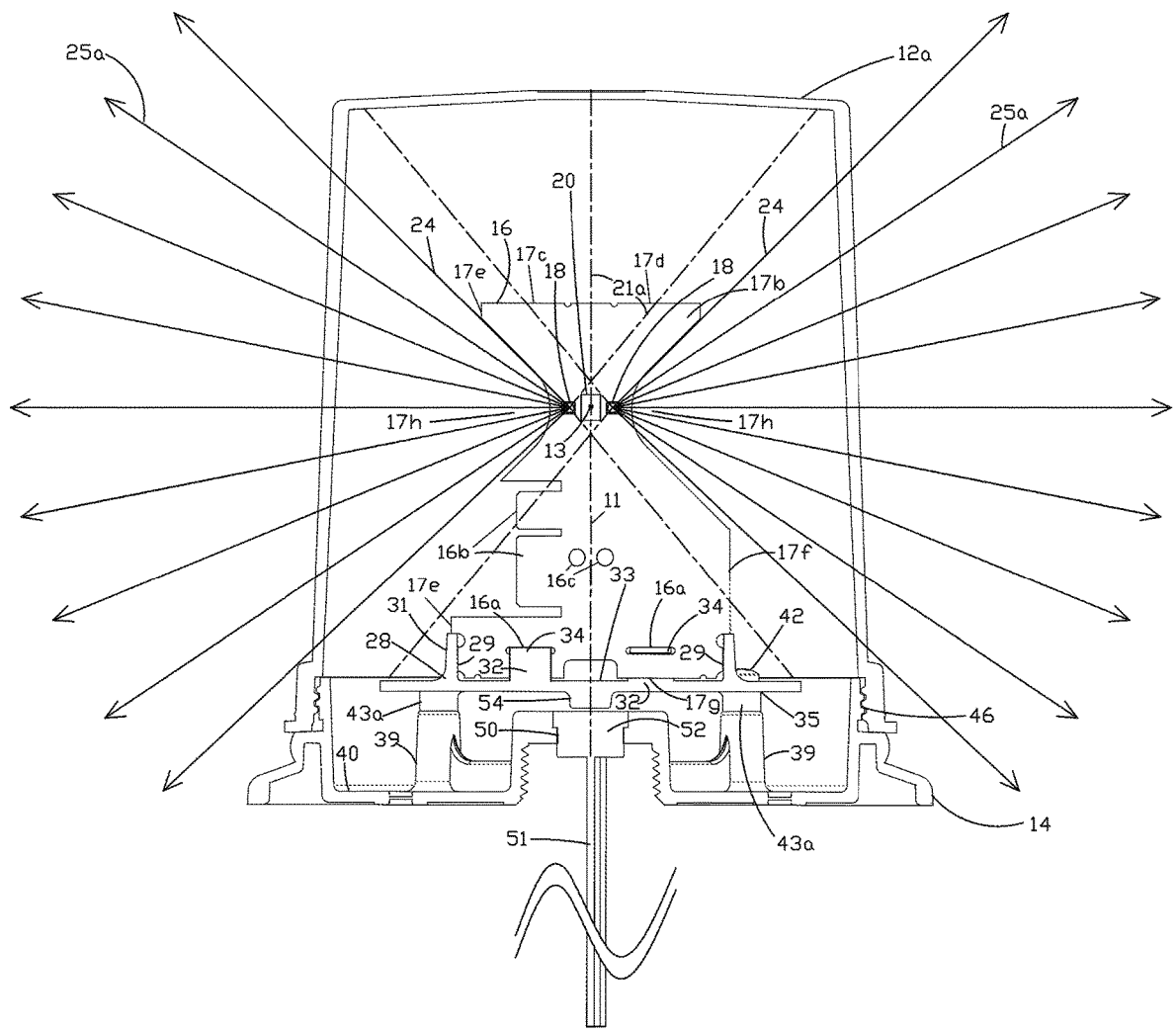
FIG. 3A is a vertical sectional view similar to FIG. 3 where the lens of the beacon is replaced with another lens shown without refractive optical properties.

The length along the first dimension 21a (FIG. 8) and height along the second dimension 21b (FIG. 7) of each of the light blocking elements 20a provides the same or similar blocking performance of light from LEDs 18 disposed there alongside light blocking element 20 in FIGS. 2 and 3 as illustrated by dashed lines extending from the LEDs 18b in FIGS. 7 and 8. Accordingly, while being disposed further from light blocking element 20a, operation of each of LEDs 18b will provide same or similar visual warning signals from beacon 10 as LEDs 18. However, the length along the first dimension 21a and height along the second dimension 21b of the light blocking elements 20a enables each of the light blocking elements 20a to provide better blocking performance of light from LEDs 18a than LED 18b disposed there alongside light than as shown for LEDs 18 of FIGS. 2 and 3. This is due to the blocking being along a higher (or greater) angle 26b for LED 18a compared to angle 26a for LED 18b, as shown in FIG. 7. Other than use of LEDs 18a and 18b, and light blocking elements 20a, beacon 10 assembly is the same as described earlier in connection with FIGS. 2-5. For purposes of illustration, bracket 28, base 14, and parts thereof are not shown in FIG. 7, and are the same as shown in FIG. 2.

Figure 9:
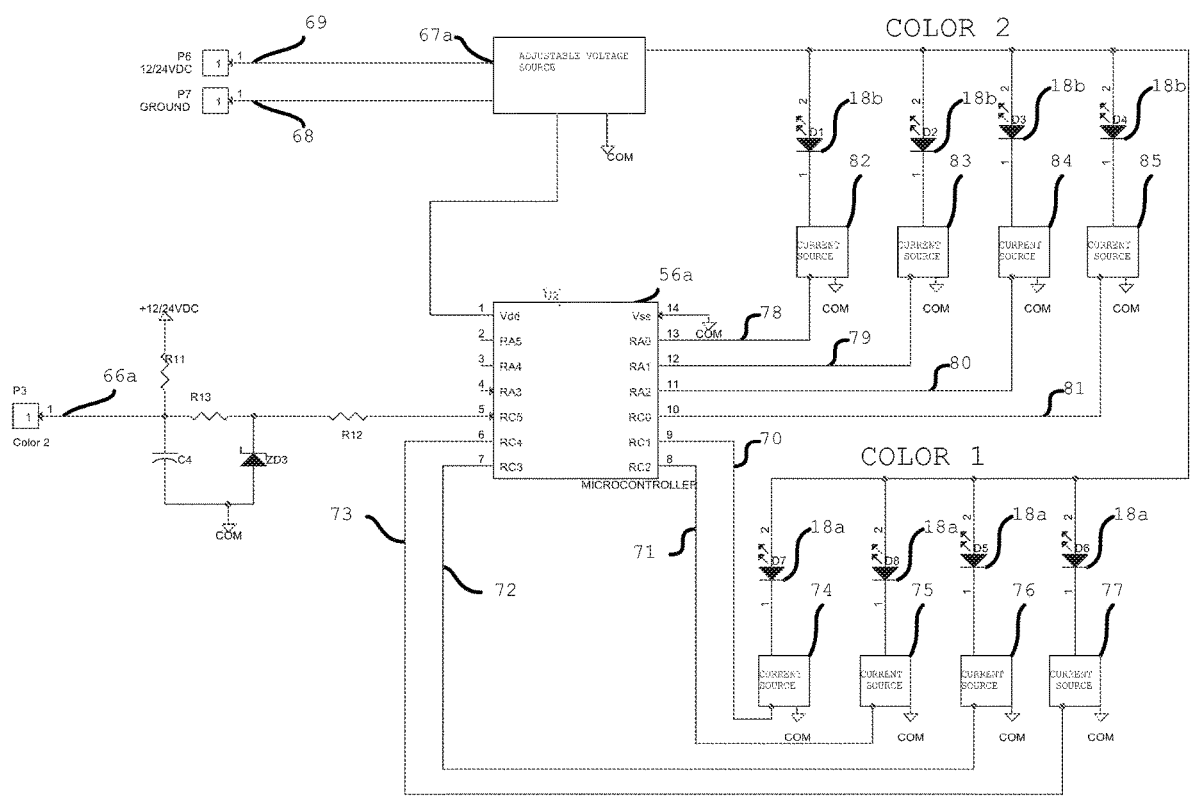
FIG. 9 is a schematic diagram of the electronics on the circuit board of FIGS. 7 and 8.

Referring to FIG. 9, a schematic of the electronics for beacon 10 is shown for operating LEDs 18a and 18b of FIGS. 7 and 8. A microcontroller (or microprocessor) 56a outputs signals along four enable lines 70, 71, 72, and 73 to individually control current sources 74, 75, 76, and 77, respectively, of four circuits for driving each of the LEDs 18a associated with quadrants Q1, Q2, Q3, and Q4, respectively. Microcontroller 56a outputs signals along four enable lines 78, 79, 80, and 81 to individually control current sources 82, 83, 84, and 85, respectively, of four circuits for driving each of the LEDs 18b associated with quadrants Q1, Q2, Q3, and Q4, respectively. In FIG. 9, LEDs 18a associated with quadrants Q1, Q2, Q3, and Q4 are labelled D5, D6, D7, and D8, respectively, and LEDs 18b associated with quadrants Q1, Q2, Q3, and Q4, are labelled D1, D2, D3, and D4, respectively. Each enable line 70-73 and 78-81 when high (on) switches on drive current to the associated LED 18a and 18b, respectively, and when low (off) disables drive current to such LED. The current sources 74-77 and 82-85 may each be provided by a MOSFET operating responsive to their respective enable lines. For purposes of illustration, other than LEDs 18a and 18b, electronics on surfaces 17a and 17b of circuit board 16 are not shown in FIGS. 7 and 8.

The microcontroller 56a operates in accordance with a program stored in its memory (ROM or RAM) to enable operation of beacon 10. For example, microcontroller 56a may be a PIC microcontroller, but other programmable logic device may be used which can output signal to each of the circuits associated with LEDs 18s and 18b.

The pattern of operation of LEDs 18a (color 1) or LED 18b (color 2) by microcontroller 56a can be selected by a pattern select input 66a. By placing on input 66a signals representative of a one of different values, addresses, codes, or instructions, detectable by the microcontroller 56a, color 1 or color 2 is selected, and also one of multiple different patterns of illumination of output light from beacon 10, such as solid on, flashing, and rotating, and if available, one of different rates or patterns of flashing or rotation. If no signal is provided along pattern select input 66a, than a default pattern and color 1 (LED 18a) is used by microcontroller 56a as set forth in memory of the microcontroller. When one of the colors 1 or 2 is selected, the enable lines of the LEDs 18a or 18b associated with the non-selected color are low (off) by the microcontroller 56a. The present invention is not limited to any particular means for color and pattern input selection to microcontroller or programmable logic device 56a. The flashing or rotating rates are in accordance with a preset on and off intervals stored in memory of the microcontroller 56a. A clock in the microcontroller 56a is used to measure each of the intervals.

Adjustable voltage source 67a represents a voltage converter to supply power to operate microcontroller 56a and operate the individual circuit driving LEDs 18a and 18b (in accordance with the particular manufacturer specifications of the LEDs) when enabled. Thus, three wires 51 are provided to beacon 10, entering via hole 50, provide a ground 68, 12/24 VDC 69, color and pattern select line 66a.

The synchronization line and/or the low power select line, as earlier described, may also be provided to microcontroller 56a. Voltage source 67a may externally receive 12 VDC or 24 VDC depending on the voltage source externally available to beacon 10. If synchronization line and power select line are present, additional two wires for such lines would be provided to microcontroller 56a in addition to wires 66a, 68, and 69. The electronics on circuit board 16 and programming of microcontroller 56a may be the same or similar as in dual-color Star Halo® LED Beacons.

The microcontroller 56a starts operating LEDs 18a or 18b in accordance with selected color and pattern, upon applied power to the microcontroller 56a from voltage source 67a, i.e., when external voltage 12/24 VDC is provided via one of wires 51. Optionally, a switch may be provided along the line from the voltage source 67a to the microcontroller 56a to enable and disable operation of beacon 10, such switch may be controlled by an external line to a computer system, controller, or device to externally control beacon 10 operation.

If the signal on pattern select input 66a detected by microcontroller 56a is for operating beacon 10 in a rotating mode for color 1, the four enable lines 70, 71, 72, and 73 are continuously sequentially activated by microcontroller 56a so that the LEDs 18a associated with quadrants Q1, Q2, Q3, and Q4 simulate a rotating light pattern from beacon 10 in the same manner as described earlier in connection with enables lines 57-60 of FIG. 6 to enable a rotating pattern. If the signal on pattern select input 66a detected by microcontroller 56a is for operating beacon 10 in a rotating mode for color 2, the four enable lines 78, 79, 80, and 81 are continuously sequentially activated by microcontroller 56a so that the light from LEDs 18b associated with quadrants Q1, Q2, Q3, and Q4 simulate a rotating light pattern from beacon 10 in the same manner as described earlier in connection with enables lines 57-60 of FIG. 6 to enable a rotating pattern.

If the signal on pattern select input 66a detected by microcontroller 56a is for operating beacon 10 in a solid on mode of color 1 or color 2, then all enable lines 70-73 or 78-81, respectively, are activated by the microcontroller 56a. If the signal on pattern select input 66a detected by microcontroller 56a is for operating beacon 10 in a flash mode of color 1 or color 2, then all enable lines 70-73 or 78-81, respectively, are switched between high and low levels simultaneously by microcontroller 56a. The rate of switching is accordance with a preset on and off intervals stored in memory of the microcontroller 56a. A single rate or multiple different rates of flashing may be stored in memory of the microcontroller 56a and selectable via the signal on pattern select input 66a. Other or different patterns of LED 18a and 18b operation can be provided by separately enabling lines 70-73 or 78-81 as desired by programming microcontroller 56a.

Figure 10:
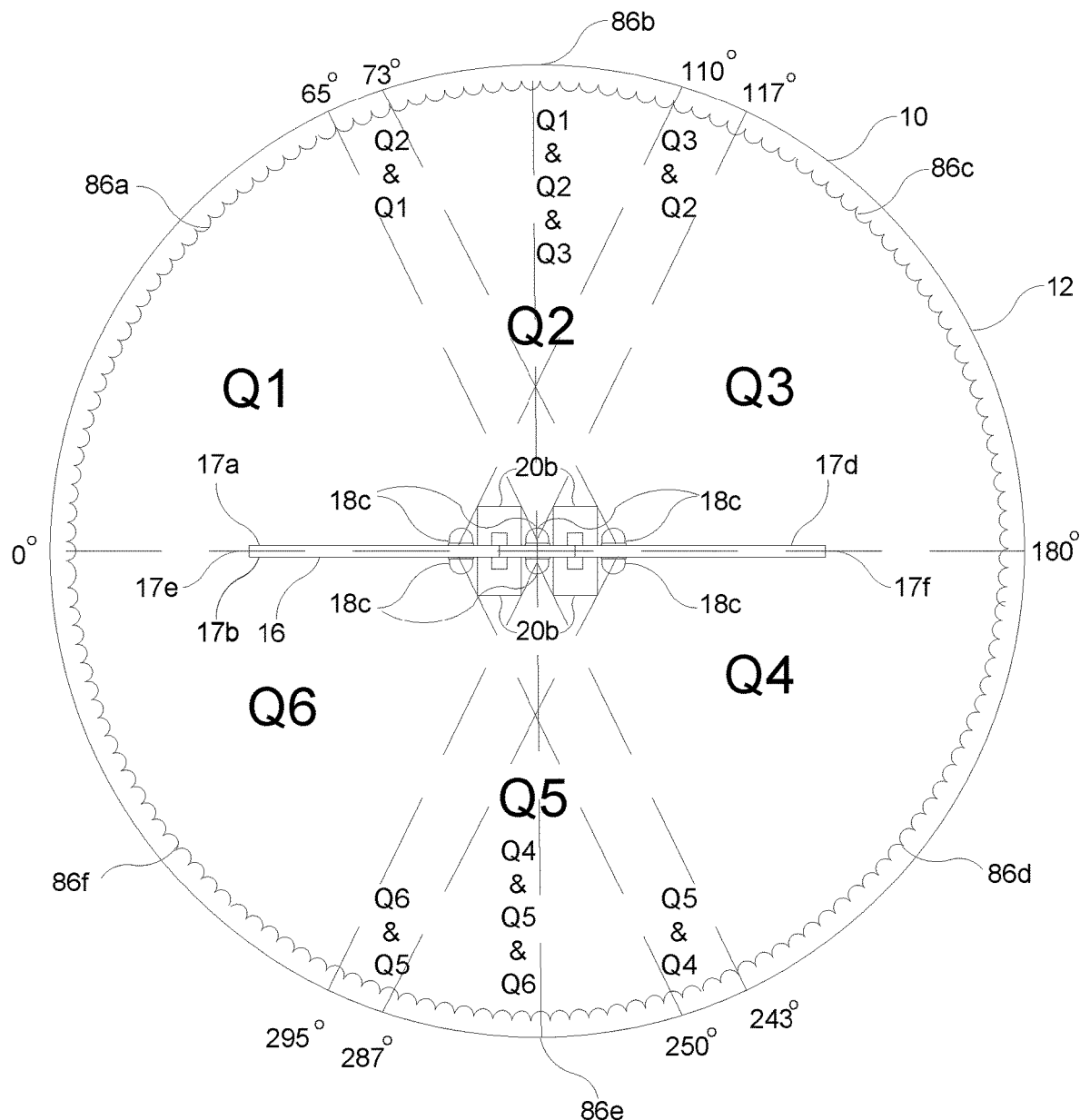
FIG. 10 is a horizontal sectional view of the beacon along line 2-2 in FIG. 1, in the direction of the arrows at the end of the section line, showing a circuit board with six LEDs disposed within the lens of the beacon.
Figure 11:
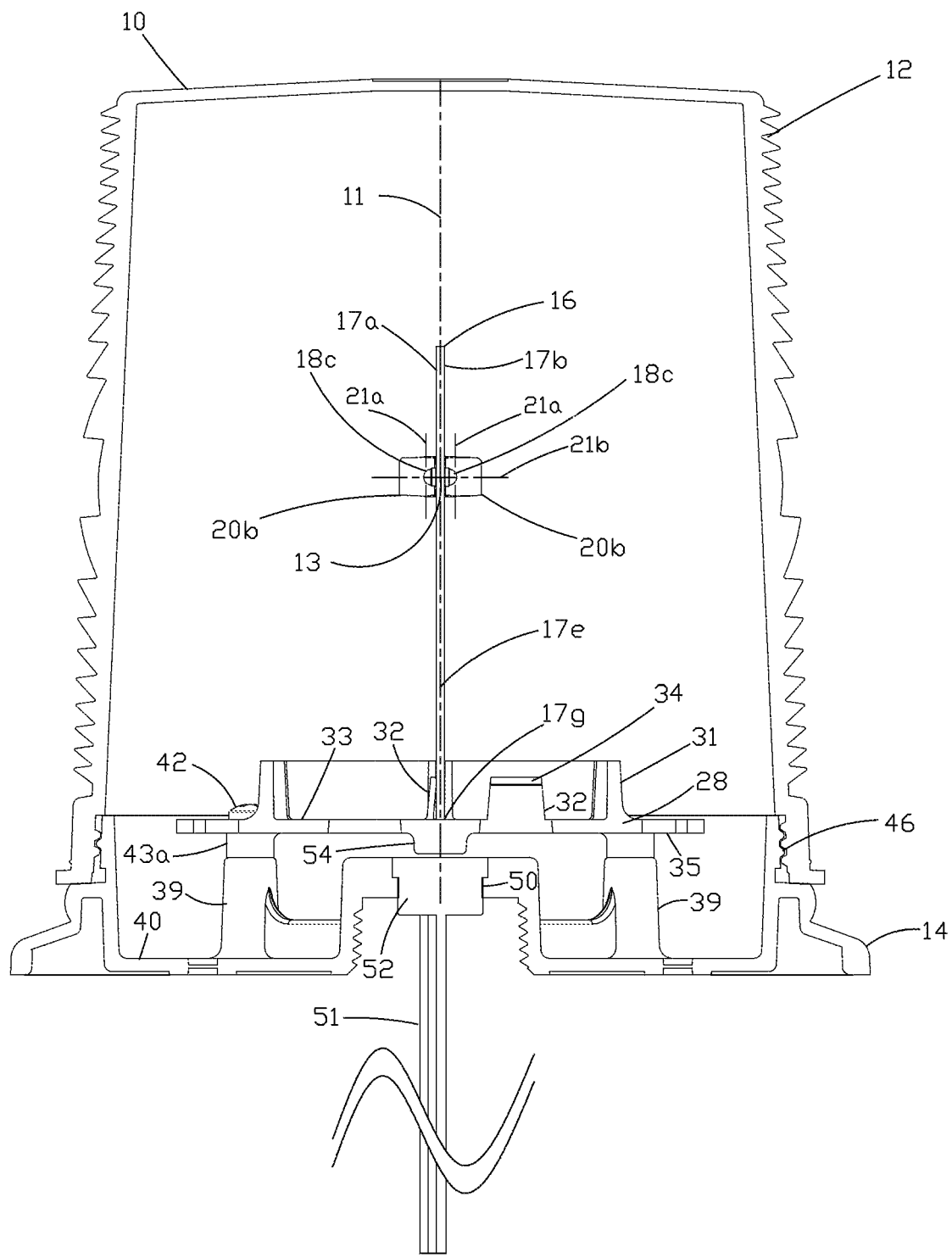
FIG. 11 is a vertical sectional view of the beacon rotated 90 degrees from line 3-3 in FIG. 1, so that the view is taken along the circuit board of FIG. 10 to show the opposing surfaces of the circuit board.
Figure 12:
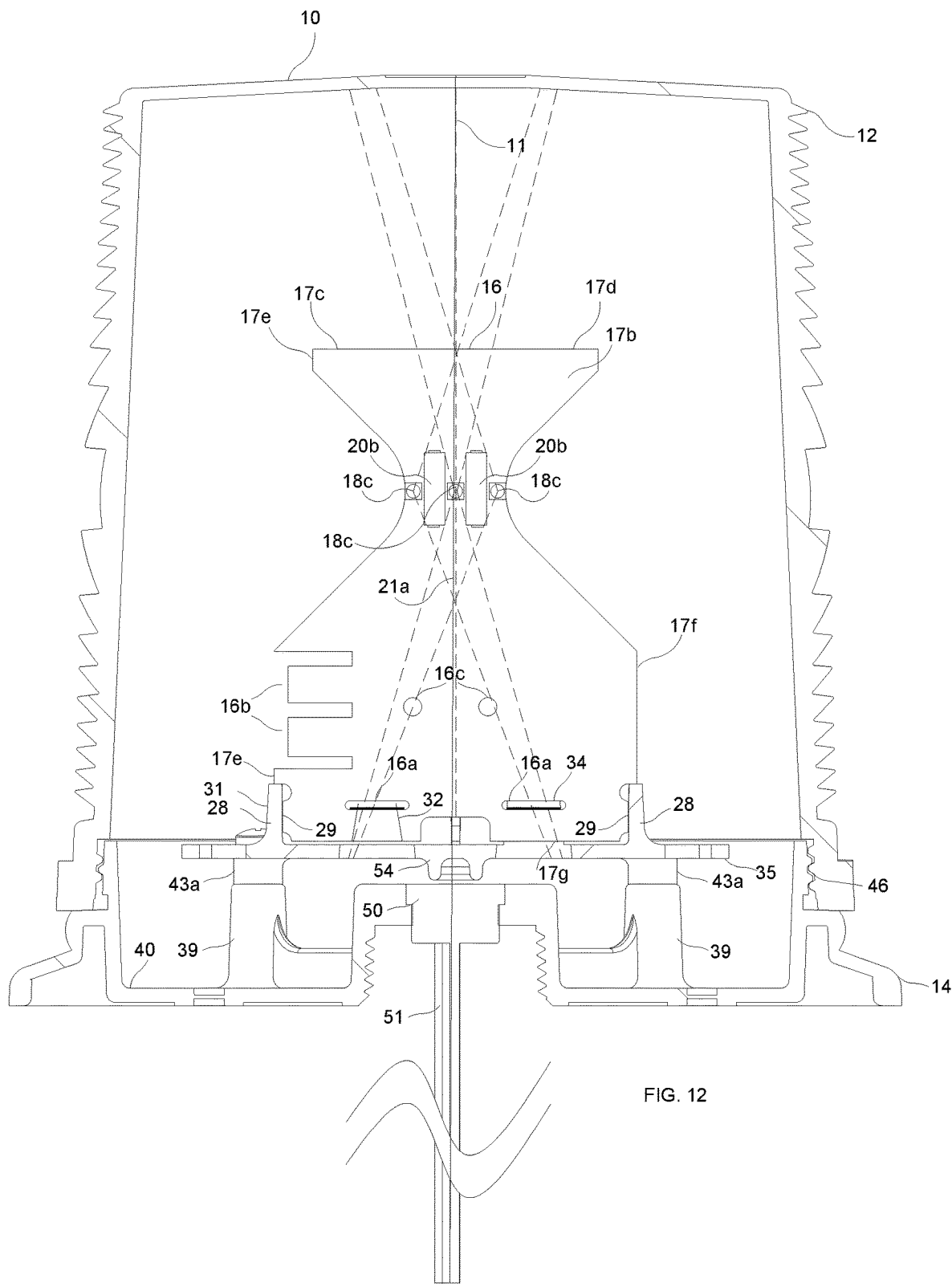
FIG. 12 is a vertical sectional view of the beacon along line 3-3 in FIG. 1 in the direction of the arrows at the end of the section line, showing one of the two opposing surfaces of the circuit board of FIGS. 10 and 11.

Referring to FIGS. 10, 11, and 12, a beacon 10 is shown having a pair of two light blocking elements 20b mounted on each of surfaces 17a and 17b of the circuit board 16, and three LEDs 18c mounted to alternate with such light blocking elements 20b. Thus, on each of surfaces 17a and 17b of the circuit board 16 one of the three LEDs 18c is disposed between the two light blocking elements 20b, and the other two LEDs 18c are each disposed along opposite sides of each of the light blocking elements 20b from the LED 18c disposed between elements 20b. Each of LEDs 18c may be, for example, the same as LEDs 18 described earlier. The four light blocking elements 20b along each of surface 17a and 17b of circuit board 16 extend away from the circuit board in a direction perpendicular to surfaces 17a and 17b. As best shown in FIG. 10, the length along the first dimension 21a parallel to central axis 11 (FIGS. 11 and 12) and height along the second dimension 21b (FIG. 11) of each of the light blocking elements 20b provides the light blocking performance for six quadrant Q1-Q6, three quadrants Q1-Q3 along surface 17a, and another three quadrants Q4-Q6 along surface 17b. The circuit board 16 is aligned along central axis 11 so that two opposing sides 17c and 17d of the circuit board 16 extend radially outward from either side of central axis 11 at 0 and 180 degrees, respectively, about the central axis to side edges 17e and 17f, respectively. As shown in FIGS. 11 and 12, LEDs 18c upon circuit board 16 are disposed at a distance from base 14 near the focal point 13 of collimating lens 12 that lies along the central axis 11 of beacon 10.

The blocking by surfaces 17a and 17b of the circuit board 16 and the four light blocking elements 20b define six regions 86a, 86b, 86c, 86d, 86e, and 86f, labelled Q1, Q2, Q3, Q4, Q5, and Q6, respectively, in FIG. 10, in which each of the LEDs 18c is associated with a different one of the regions. Light in Q2 is principally being provided from the LED 18c between the two light blocking elements 20b upon surface 17a of the circuit board 16, and light in Q5 is principally being provided from the LED 18c between the two light blocking elements 20b upon surface 17b of the circuit board. Thus, light from the six light sources of LEDs 18c preferentially direct illumination substantially toward their associated six regions along 360 degree circumference of the dome. Along surface 17a of the circuit board 16, Q1 and Q3 partially overlap in Q2, while along surface 17b of the circuit board 16, Q4 and Q6 partially overlap in Q5.

The circumferential portion of lens 12 for each region Q1, Q2, Q3, Q4, Q5, and Q6 depends on the height of the four light blocking elements 20b from the circuit board 16. In the example shown in FIG. 10, Q1 extends 0 to about 110 degrees, Q2 extends 65 to 117 degrees, Q3 extends 73 to 180 degrees, Q4 extends 180 to 287 degrees, Q5 extends 243 to 295 degrees, and Q6 extends 250 to 360 degrees, about the 360 degrees of the circumference of lens 12. The particular ranges of the regions along surfaces 17a and 17b depend on the desired height of light blocking elements 20*b* from the circuit board 16, thus other ranges for the regions may be used than shown in FIG. 10 about the 360 circumference of lens 12. As shown in FIG. 10, the portion of overlapping regions of the light from each of LEDs 18*c* when activated in Q1, Q2, and Q3 into other regions along the same surface 17*a* are denoted by dashed lines in regions labelled Q2&Q1, Q1&Q2&Q3, Q3&Q2. The overlapping regions of the light from LEDs 18*c* when activated in Q4, Q5, and Q6 into other regions along the same surface 17*b* are denoted by dashed lines in regions labelled Q6&Q5, Q4&Q5&Q6, Q5&Q4.

The electronics of the beacon 10 of FIGS. 10 and 11 may be as shown in FIG. 6, where four LEDs 18*c* in Q1-Q4 provide the four LEDs 18 shown, but two additional circuits are provided for LEDs 18*c* for Q5 and Q6, each such additional circuit being identical to one of the four shown for the LED of Q1-Q4, and are similarly controlled by microcontroller 56 using enable lines to current sources of those two additional circuits. Operation of beacon 10 for solid on and flash pattern with six LEDs 18*c* is the same as described earlier in connection with FIG. 6, but using six enable lines to provide light from LED 18*c* in regions Q1-Q6. Operation of beacon 10 with LEDs 18*c* in a rotation mode is the same as described earlier in connection with FIG. 6, but using two additional fifth and six states associated with the two regions Q5 and Q6 to sequentially continuously activate LEDs 18*c* in order of regions Q1, Q2, Q3, Q4, Q5 and Q6 to simulate rotating warning light signals from beacon 10, or in the reverse rotational direction of Q6, Q5, Q4, Q3, Q2, and Q1, as selected by pattern select input 66. Other than use of LEDs 18*c* and light blocking elements 20*b*, beacon 10 assembly is the same as described earlier in connection with FIGS. 2-5. For purposes of illustration, bracket 28, base 14, and parts thereof are not shown in FIG. 10, and are the same as shown in FIG. 2.

As shown above, each of the two surfaces 17*a* and 17*b* of the circuit board 16 may have: (i) two groups of light sources each with an LED 18 providing the same color light with single light blocking element 20 mounted there between, defining four light receiving regions Q1, Q2, Q3, and Q4 along the 360 degrees of the lens (FIGS. 2-6); or (ii) two groups of light sources each with two LEDs 18*a* and 18*b* providing a different color of light, and a single light blocking element 20*a* mounted there between, defining dual color four light receiving regions Q1, Q2, Q3, and Q4 along the 360 degrees of the lens (FIGS. 7-9); or (iii) three groups of light sources, each having an LED 18*c*, with two light blocking elements 20*b* to define six light receiving regions along the 360 degrees of the lens (FIGS. 10-12). Thus, along each surface 17*a* and 17*b*, the number of groups of light sources may equal one more than the number of light blocking elements 20 along the surface. However, different number of LEDs may be provided in each group of light sources of same or different colors with similar circuitry as shown for other LEDs in FIG. 6 or 9, and other number of light blocking elements may be mounted upon each of surfaces 17*a* and 17*b* of the circuit board 16 to define other number of regions along the 360 degrees of lens 12 or 12*a* than four or six.

In the beacons 10 shown with four LEDs 18 of FIGS. 2-6, eight LEDs 18*a* and 18*b* of FIGS. 7-9, and six LEDs 18*c* of FIGS. 10-12, the heat generated during the operation of the LEDs when powered is readily dissipated to the atmosphere within the dome provided by lens 12 (or 12*a*), however additional thermally conductive material may be provide along the circuit board 16 to assist in dissipating heat to the base 14 of the beacon. While each the LEDs 18, 18*a*, 18*b*, and 18*c* preferably represents a single light source, each LED may present multiple light sources. Further, while the number of LEDs 18, 18*a*, 18*b*, and 18*c* are equal on each of surfaces 17*a* and 17*b* of the circuit board, unequal number of LEDs may be mounted on such surfaces.

From the foregoing description, it will be apparent that there has been provided improved warning light beacons with light sources provided by LEDs. Variations and modifications in the herein described beacons within the scope of the invention will undoubtedly suggest themselves to those skilled in the art. Accordingly, the foregoing description should be taken as illustrative and not in a limiting sense.

The invention claimed is:

1. A warning light beacon comprising:
a base;
a lens providing a dome over the base;
a circuit board extending upright from the base along a central axis perpendicular to the base, said circuit board having two surfaces facing opposite directions, each of said two surfaces having a plurality of light sources mounted near said central axis;
one or more light blocking elements are mounted upon each of said two surfaces, in which each one of said one or more light blocking element is mounted between groups of one or more of said light sources along the surface, to dispose each of said groups of one or more said light sources to substantially illuminate a different one of a plurality of regions about 360 degrees of the lens; and
each of said different ones of said regions being illuminated sequentially along the 360 degrees of said lens by at least one of said one or more said light sources of one of said groups associated with the region to enable perception of rotating light outward via the lens for conveying rotating visual warning signals from the beacon.

2. The warning light beacon according to claim 1 wherein said light sources are each an LED.

3. The warning light beacon according to claim 1 each said one or more light blocking elements is an electrical component mounted to the circuit board.

4. The warning light beacon according to claim 3 wherein said electrical component is non-electrically operative in circuitry on said circuit board for enabling operation of said light sources.

5. The warning light beacon according to claim 1 wherein said one or more light blocking elements are mounted to the circuit board along each of said two surfaces to extend along a dimension perpendicular thereto and higher along said dimension than those ones of said light sources mounted along the surface.

6. The warning light beacon according to claim 5 wherein each of said one or more light blocking elements only substantially blocks illumination from each of two different ones of said groups disposed along opposing sides of the light blocking element.

7. The warning light beacon according to claim 6 wherein for each of said regions illuminated by the groups of one or more said light sources along a same one of said two surfaces of said circuit board, a portion of illumination from the region extends into one or more other of said regions along said same one of said two surfaces.

8. The warning light beacon according to claim 1 further comprising a controller for selectably operating at least one of said one or more said light sources of one of said groups associated each of said different ones of said regions to enable each of said different ones of said regions to be illuminated sequentially along the 360 degrees of said lens.

9. The warning light beacon according to claim 8 wherein said controller further selectably operates at least one of said one or more said light sources of each of said groups associated each of said different ones of said regions simultaneously to enable illumination of all of said regions in one of solid on or flashing patterns of visual warning signals from the beacon.

10. The warning light beacon according to claim 1 wherein said at least one of said one or more said light sources for each of said groups is operative in a first mode to provide said rotating visual warning signals, a second mode of solid on, and a third mode of flashing patterns of visual warning signals from the beacon.

11. The warning light beacon according to claim 1 wherein said light sources in each of said groups provide different colors of lights, and at least one of one or more said light sources of a selected one of said different colors for each of said groups is operative in a first mode of said rotating visual warning signals, a second mode of solid on, and a third mode of flashing patterns of visual warning signals from the beacon.

12. The warning light beacon according to claim 1 wherein each of said two surfaces has two of said groups of one or more said light sources, and one of said one or more light blocking elements separating said two of said groups, and said plurality of regions represent four quadrants about the 360 degrees of the lens.

13. The warning light beacon according to claim 1 wherein along each of said two surfaces two of said one or more light blocking elements are mounted alternating between different ones of three of said groups of one or more said light sources, and said plurality of regions number six about the 360 degrees of the lens.

14. The warning light beacon according to claim 1 wherein said light sources provide different colors of light, and each of said groups has at least one of said light sources of each of said different colors, and each of said different ones of said regions being illuminated sequentially along the 360 degrees of said lens, by said at least one of said one or more said light sources of a selected one of said different colors of said one of said groups associated with the region, to enable perception of rotating light outward via the lens for conveying rotating visual warning signals from the beacon of said one of said different colors.

15. The warning light beacon according to claim 14 wherein said light sources provide two different colors of light.

16. The warning light beacon according to claim 1 wherein said light sources provide a same color of light.

17. The warning light beacon according to claim 1 wherein said lens provides collimation of light from each of said light sources when activated outwards from the beacon.

18. The warning light beacon according to claim 1 wherein said lens provides non-collimated light from each of said light sources when activated outwards from the beacon.

19. The warning light beacon according to claim 1 wherein each of said one or more light blocking elements is an electrical component mounted to the circuit board, and multiple ones of said electrical component are mounted beside each other parallel to said central axis.

20. A warning light beacon comprising:
a base;
a lens providing a dome over the base to a height, and a central axis within said dome extending perpendicular to said base;
a circuit board disposed perpendicular to said base, in which said circuit board has two sides extending radially in opposite directions at 0 and 180 degrees from said central axis, and two surfaces facing opposite directions;
two light blocking elements each mounted to a different one of said two surfaces of said circuit board to extend outward away from each other in opposite directions at 90 and 270 degrees from said central axis, so that said sides of said circuit board and said light blocking elements define four radial quadrants in said beacon; and
four groups of one or more LEDs, each of said groups being mounted to said circuit board to illuminate a different one of said quadrants, in which each one of said two surfaces of said circuit board has two different ones of said groups with a different one of said light blocking elements disposed there between, in which activating at least one of the LEDs in each of the groups sequentially about said central axis enables perception of rotating light outward via said lens.

21. The warning light beacon according to claim 20 wherein said light blocking elements are each an electrical component mounted to the circuit board.

22. The warning light beacon according to claim 20 wherein at least one of said one or more LEDs in each of said groups are activated simultaneously in one of a solid on or flash pattern.

23. The warning light beacon according to claim 20 wherein said LEDs provide light of a same color.

24. The warning light beacon according to claim 20 wherein at least two of said LEDs in each of said groups provide a different color of light, in which activating the LEDs of each of said different color in each of the groups sequentially about said central axis enables perception of rotating light outward via said lens of the different color.

25. The warning light beacon according to claim 20 wherein said LEDs are mounted to said circuit board above said base to each provide light which at least substantially fills the lens along said height that extends from said base to a top of said beacon.

26. The warning light beacon according to claim 20 wherein said lens provides collimation of light from each of said LEDs when activated outwards from the beacon, and said LEDs being disposed along said circuit board at a distance above said base near a focal point of said lens.

27. A method for providing visual warning signals from a beacon having a base and a lens providing a dome over said base, said method comprising steps of:
disposing a circuit board upright from the base along a central axis perpendicular to the base;
providing a plurality of light sources mounted near said central axis upon each of two surfaces of said circuit board;
mounting one or more light blocking elements upon each of said two surfaces, each one of said one or more light blocking elements being mounted between groups of one or more of said light sources along the surface, to dispose each of said groups to substantially illuminate a different one of a plurality of regions about 360 degrees of the lens; and
illuminating each of said different ones of said regions sequentially along the 360 degrees of said lens, by at least one of said one or more said light sources of one of said groups associated with the region, to enable perception of rotating light outward via the lens for conveying rotating visual warning signals from the beacon.

28. The method according to claim 27 wherein said mounting step further comprises the step of mounting along each of said two surfaces two of said groups of one or more said light sources and one of said one or more light blocking elements between said two of said groups of one or more said light sources, to provide said a plurality of regions representing four quadrants about the 360 degrees of the lens.

29. The method according to claim 27 wherein said mounting step further comprises the step of mounting along each of said two surfaces two of said one or more light blocking elements alternating between different ones of three of said groups of one or more said light sources, and said plurality of regions number six about the 360 degrees of the lens.

30. The method according to claim 27 wherein said providing step further comprises the step of providing said plurality of light sources which produce light of a same color.

31. The method according to claim 27 wherein said providing step further comprises the step of providing said plurality of light sources which produce light of different colors mounted near said central axis upon each of the two surfaces of said circuit board; and said illuminating step further comprises the step of illuminating each of said different ones of said regions sequentially along the 360 degrees of said lens, by at least one of said one or more said light sources of a selected one of said different colors of said one of said groups associated with the region, to enable perception of rotating light outward via the lens for conveying rotating visual warning signals from the beacon of said selected one of said different colors.

32. The method according to claim 27 further comprising the step of illuminating each of said regions simultaneously, by at least one of said one or more said light sources of each of said groups associated with each of said different ones of said regions, to provide one of solid on or flashing patterns of visual warning signals from the beacon.

* * * * *